(12) United States Patent
Xie

(10) Patent No.: US 10,652,377 B2
(45) Date of Patent: May 12, 2020

(54) ELECTRONIC ASSEMBLY AND ELECTRONIC DEVICE

(71) Applicant: GUANGDONG OPPO MOBILE TELECOMMUNICATIONS CORP., LTD., Dongguan, Guangdong (CN)

(72) Inventor: Xiangkun Xie, Guangdong (CN)

(73) Assignee: GUANGDONG OPPO MOBILE TELECOMMUNICATIONS CORP., LTD., Dongguan, Guangdong (CN)

(*) Notice: Subject to any disclaimer, the term of this patent is extended or adjusted under 35 U.S.C. 154(b) by 0 days.

(21) Appl. No.: 16/188,762

(22) Filed: Nov. 13, 2018

(65) Prior Publication Data

US 2019/0208045 A1 Jul. 4, 2019

(30) Foreign Application Priority Data

Dec. 29, 2017 (CN) .......................... 2017 1 1484347
Dec. 29, 2017 (CN) .......................... 2017 1 1499799
(Continued)

(51) Int. Cl.
*H04M 1/02* (2006.01)
*H04B 1/3827* (2015.01)
(Continued)

(52) U.S. Cl.
CPC ........ *H04M 1/0277* (2013.01); *H04B 1/3833* (2013.01); *H04M 1/026* (2013.01);
(Continued)

(58) Field of Classification Search
CPC ................ H04M 1/0277; H05K 1/189; H05K 2201/10151
See application file for complete search history.

(56) References Cited

U.S. PATENT DOCUMENTS

| 2012/0243721 A1* | 9/2012 | Inoda ..................... H04R 3/005 381/365 |
| 2015/0010191 A1* | 1/2015 | Baumhauer, Jr. ........ H04R 1/04 381/355 |

(Continued)

FOREIGN PATENT DOCUMENTS

| CN | 204119279 U | 1/2015 |
| CN | 104821972 A | 8/2015 |

(Continued)

OTHER PUBLICATIONS

European search report,EP18208896.3, dated Feb. 19, 2019 (7 pages).
International search report,PCT/CN2018/118675, dated Jan. 31, 2019 (11 pages).

*Primary Examiner* — William H. Mayo, III
*Assistant Examiner* — Hiram E Gonzalez

(57) ABSTRACT

The electronic assembly may include a flexible circuit board, a sensor, and a receiver. The flexible circuit board may include a first face and a second face opposite to the first face. The sensor may be disposed on the first face of the flexible circuit board and electrically connected to the flexible circuit board. The receiver may be disposed on the second face of the flexible circuit board. A sound channel for the receiver may be communicated to outside bypassing the flexible circuit board or through the flexible circuit board.

18 Claims, 25 Drawing Sheets

(30) Foreign Application Priority Data

Dec. 29, 2017 (CN) .................... 2017 2 1908940 U
Dec. 29, 2017 (CN) .................... 2017 2 1927649 U

(51) Int. Cl.
*H05K 1/18* (2006.01)
*H04M 1/03* (2006.01)

(52) U.S. Cl.
CPC ........... *H04M 1/0266* (2013.01); *H04M 1/03* (2013.01); *H05K 1/189* (2013.01); *H04M 2250/12* (2013.01); *H05K 2201/05* (2013.01); *H05K 2201/10151* (2013.01)

(56) References Cited

U.S. PATENT DOCUMENTS

| | | | |
|---|---|---|---|
| 2016/0309264 A1 | 10/2016 | Murthy et al. | |
| 2017/0047791 A1* | 2/2017 | Jang ................... | H02J 50/90 |
| 2018/0156964 A1* | 6/2018 | Song ................... | G02B 6/0045 |

FOREIGN PATENT DOCUMENTS

| | | |
|---|---|---|
| CN | 205545396 U | 8/2016 |
| CN | 206596156 U | 10/2017 |
| CN | 207782873 U | 8/2018 |
| CN | 208128300 U | 11/2018 |
| WO | WO2012094722 A1 | 7/2012 |

* cited by examiner

ELECTRONIC ASSEMBLY AND ELECTRONIC DEVICE

CROSS-REFERENCE TO RELATED APPLICATIONS

This application claims priorities to Chinese Patent Application No. 201721927649.3, filed on Dec. 29, 2017, Chinese Patent Application No. 201711499799.3, filed on Dec. 29, 2017, Chinese Patent Application No. 201721908940.6, filed on Dec. 29, 2017, and Chinese Patent Application No. 201711484347.8, filed on Dec. 29, 2017, the contents of which are herein incorporated by reference in their entireties.

TECHNICAL FIELD

The present disclosure generally relates to the technical field of electronic device, and in particular relates to an electronic assembly and an electronic device.

BACKGROUND

With the development of electronic devices, a requirement for a thinner mobile phone becomes higher. In related technology, in order to realize more functions in an electronic device such as a mobile phone, more components are integrated inside the electronic device, and position relationships among various components become more complicated. Therefore, the requirement for the thinner mobile phone is affected greater, which is disadvantageous to design the mobile phone.

BRIEF DESCRIPTION OF THE DRAWINGS

In order to make the technical solution described in the embodiments of the present disclosure more clearly, the drawings used for the description of the embodiments will be briefly described. Apparently, the drawings described below are only for illustration but not for limitation. It should be understood that, one skilled in the art may acquire other drawings based on these drawings, without making any inventive work.

DETAILED DESCRIPTION

Figure 1:
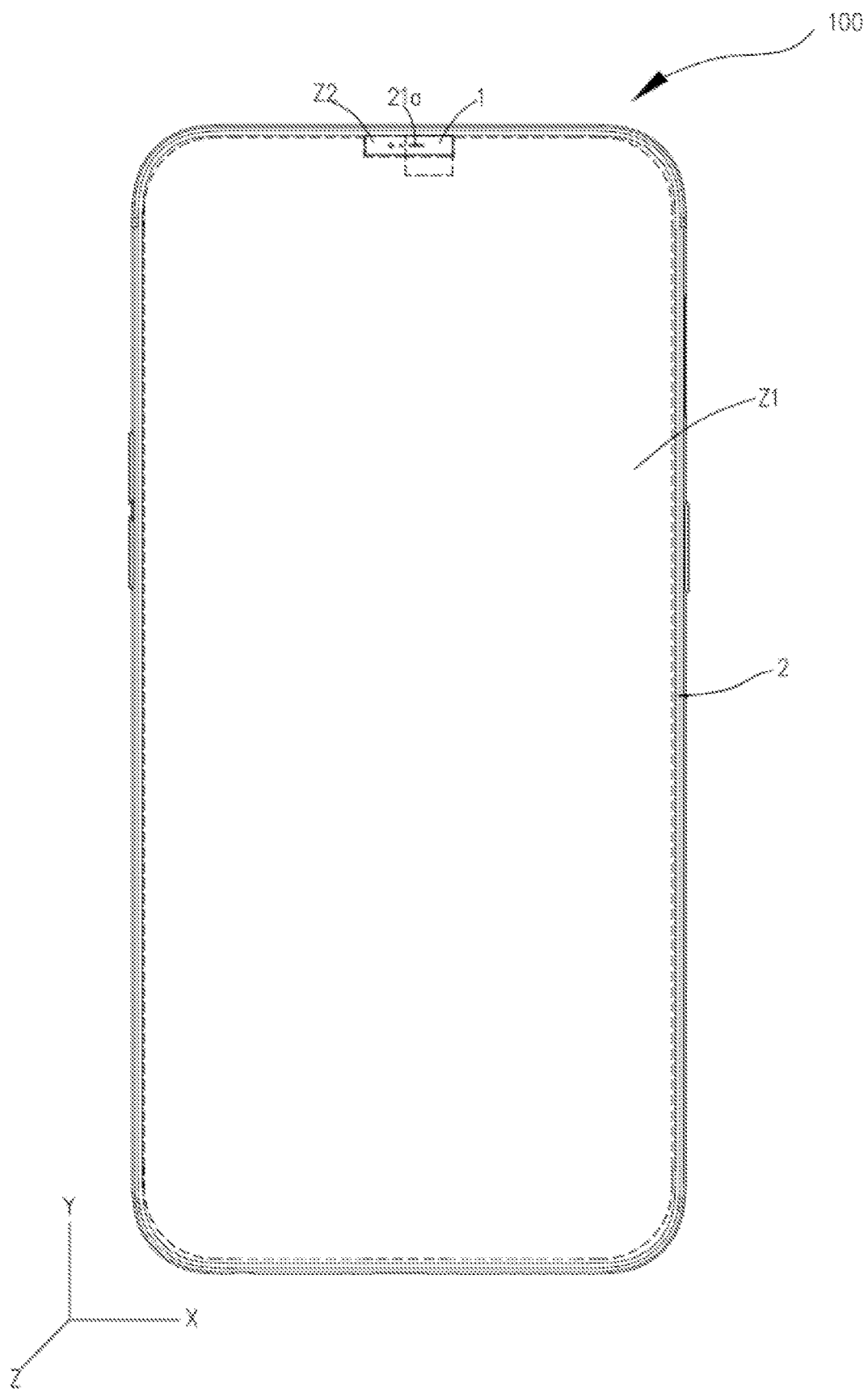
FIG. 1 is a schematic view of an exemplary electronic device according to one embodiment of the present disclosure.

A technical scheme in embodiments of the present disclosure will be clearly and completely described with reference to the drawings in embodiments of the present application.

In order to more clearly understand the above objects, features and advantages of the present disclosure, the technical scheme of the present disclosure will be described in detail with reference to the accompanying drawings and specific embodiments. It should be noted that the embodiments and the features in the present application may be combined with each other without being conflicted.

Numerous specific details are set forth in the following description in order to facilitate a thorough understanding of the present disclosure. The described embodiments are merely a part of the present disclosure, but not all of the present disclosure. All other implementations made by the those skilled in the art based on the embodiments of the present disclosure without creative labor are within the scope of the present disclosure.

In addition, description in the following embodiments is referred to attached drawings, which illustrates embodiments in which the present disclosure may be implemented. In the specification of the present disclosure, it is to be understood that terms such as "central", "length", "width", "thickness", and the like, refer to the orientations illustrated in the drawings, and in order to describe the present disclosure and describe in a simple manner, those terms are used, which are not intended to indicate or imply that the device or the elements are disposed to locate at the specific directions or are structured and performed in the specific directions. Therefore, they could not to be understood as limiting the present disclosure.

In the present disclosure, unless specified or limited otherwise, terms "mounted", "connected", "coupled", "fixed", and the like are used in a broad sense, and may include, for example, fixed connections, detachable connections, or integral connections; may also be mechanical or electrical connections; may also be direct connections or indirect connections via intervening structures; may also be inner communications of two elements, as can be understood by those skilled in the art depending on specific contexts.

In the following, an electronic device provided in embodiments of the present disclosure will be described with reference to drawings.

The electronic device may be one of any smart devices, such as a tablet computer, a mobile phone, a camera, a personal computer, a notebook computer, an on-board device, an intelligent wearable equipment, etc. It is noted that, the electronic device is described in a viewing angle for simplicity. The width direction of the electronic device is defined as the X direction, the length direction of the electronic device is defined as the Y direction, and the thickness direction of the electronic device is defined as the Z direction.

An electronic device 100 in accordance with an exemplary embodiment is illustrated in FIGS. 1-23. The electronic device 100 will be described in the following with reference to FIGS. 1-23.

Please referring to FIG. 1, which illustrates the electronic device 100 in the viewing angle, the electronic device 100 may include an electronic assembly 1. The electronic assembly 1 is housed inside the electronic device 100, and configured to implement functions of the electronic device 100, such as a function for receiving speech.

Figure 2:
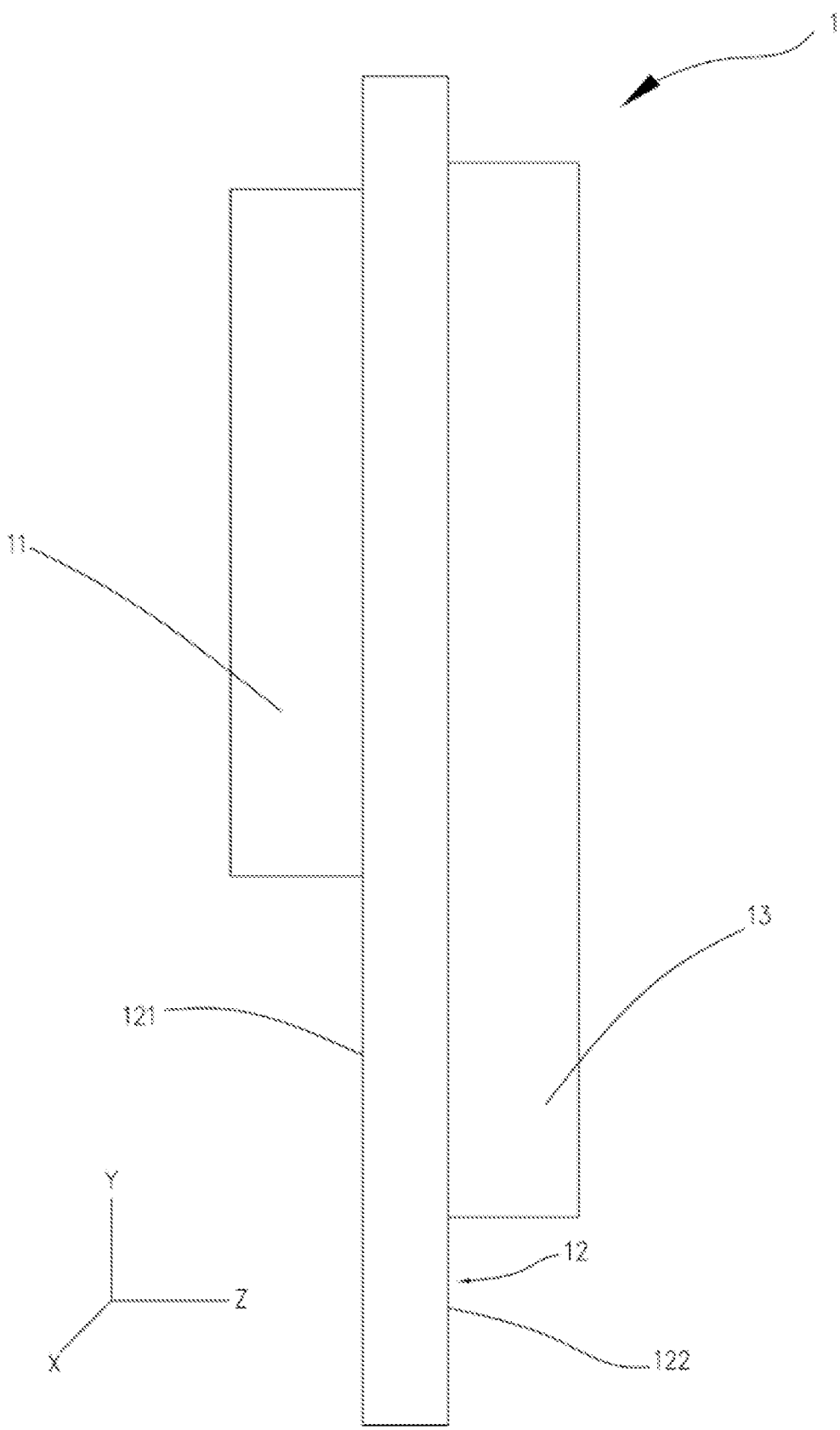
FIG. 2 is a schematic view of an electronic assembly of the electronic device in FIG. 1.

Please referring to FIG. 2 together, which is a schematic view of the electronic assembly 1 of the electronic device shown in FIG. 1, the electronic assembly 1 may include a sensor 11, a flexible circuit board 12, and a receiver 13. The sensor 11, the flexible circuit board 12 and the receiver 13 are stacked. As the electronic assembly 1 having the sensor 11, the flexible circuit board 12 and the receiver 13 stacked is assembled in the electronic device 100, the sensor 11, the flexible circuit board 12, and the receiver 13 are sequentially stacked along the Z direction of the electronic device 100. Thus, a size for the electronic assembly 1 in the X direction is reduced, and a size for the electronic device 100 in the X direction is therefore reduced.

Figure 3:
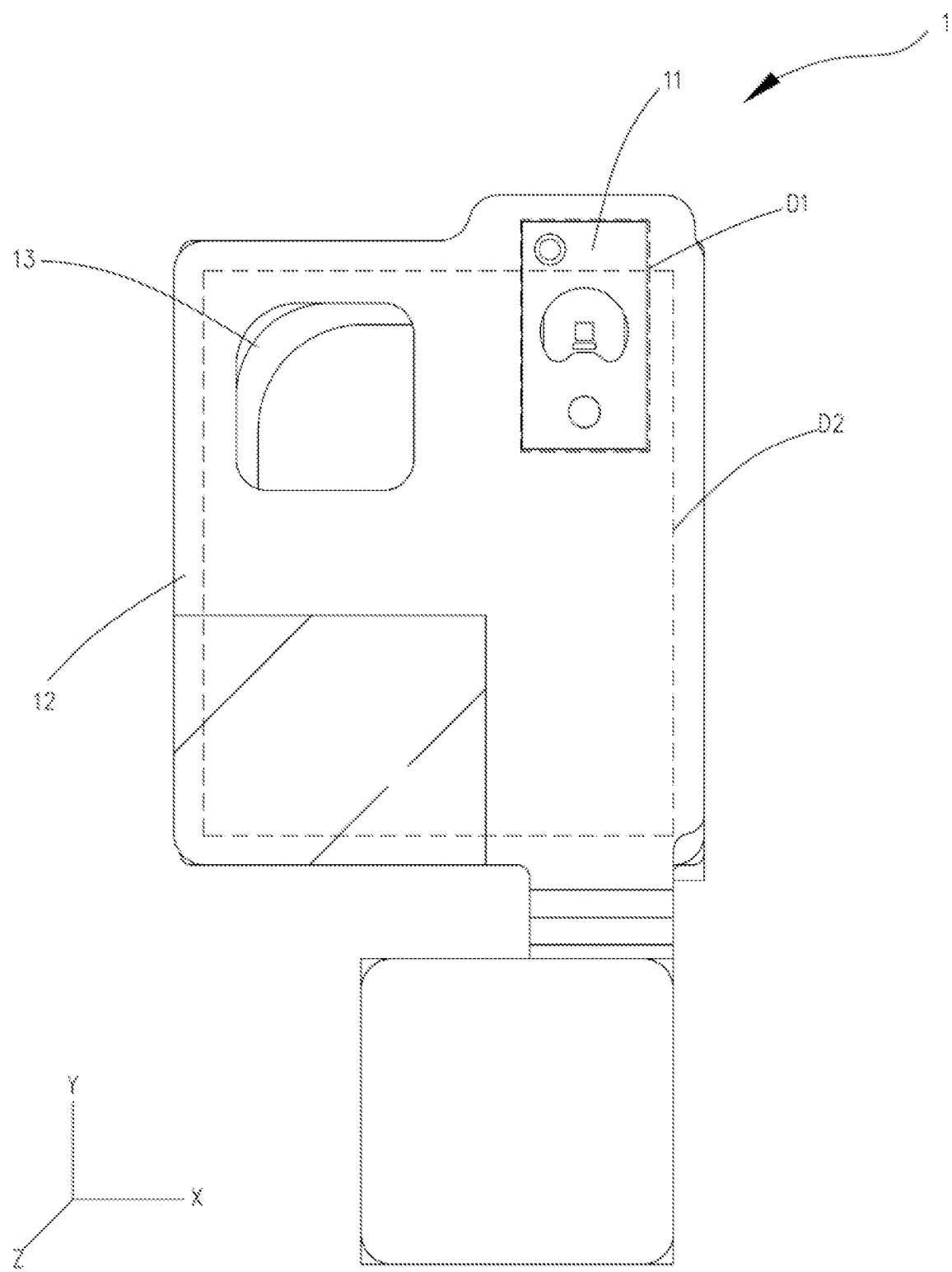
FIG. 3 is a schematic view illustrating a relative relationship between a sensor and a receiver of the electronic assembly in FIG. 2 according to an example.
Figure 4:
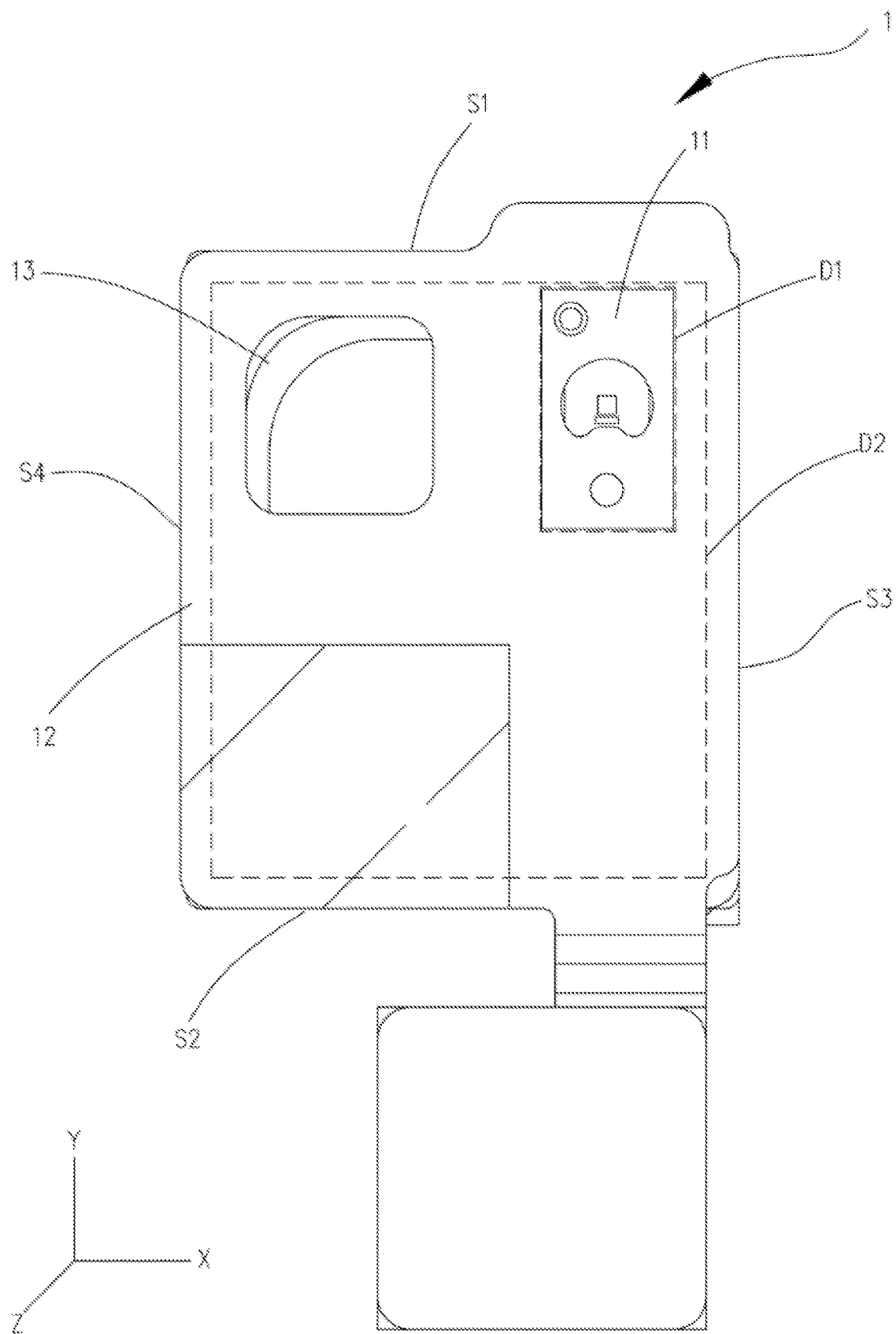
FIG. 4 is a schematic view illustrating a relative relationship between a sensor and a receiver of an electronic assembly according to another example.
Figure 5:
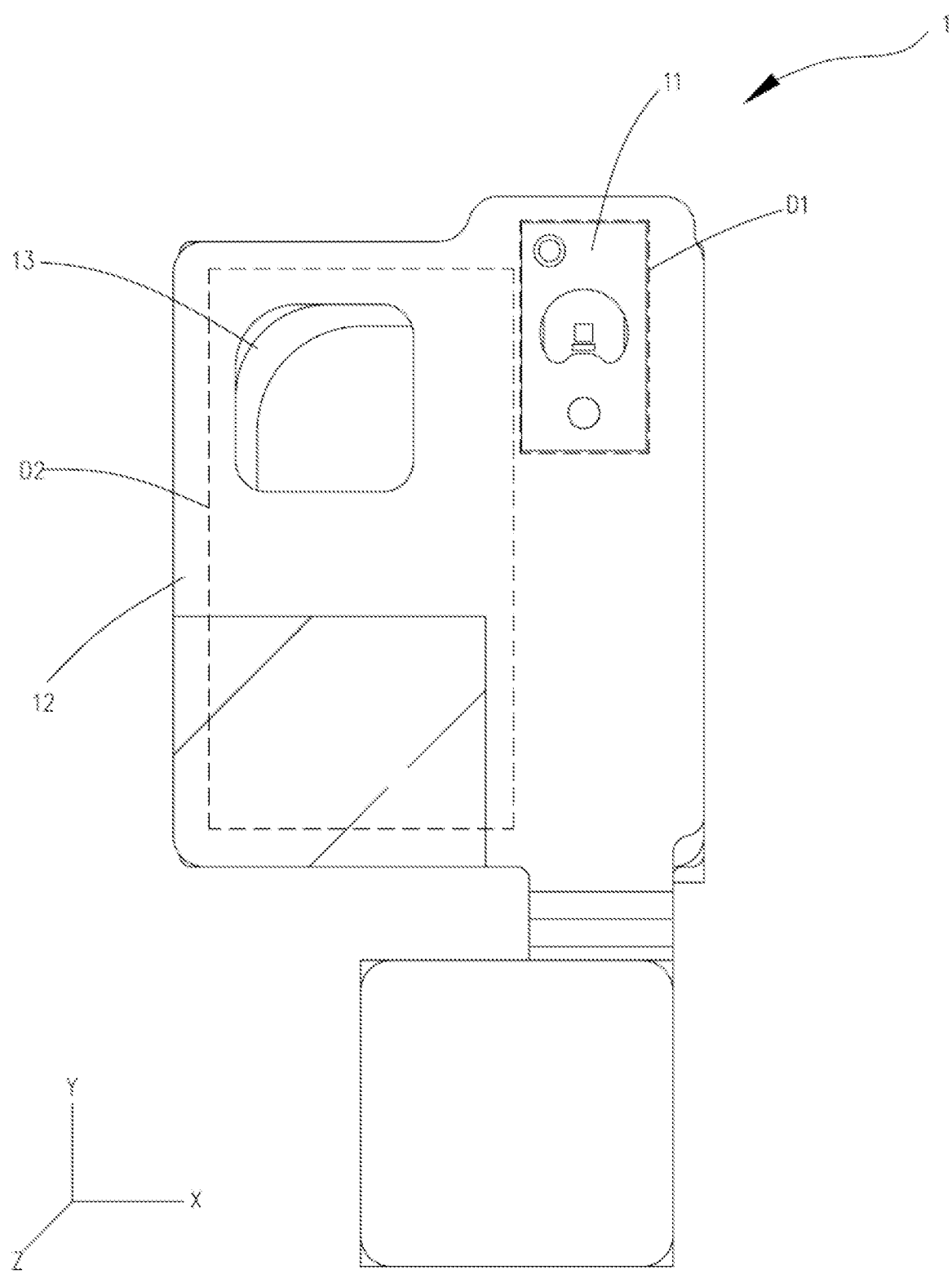
FIG. 5 is a schematic view illustrating a relative relationship between a sensor and a receiver of an electronic assembly according to yet another example.

Further, please referring to FIG. 3, 4, or 5, an orthographic projection area of the sensor 11 on the flexible circuit board 12 is marked as D1, and an orthographic projection area of the receiver 13 on the flexible circuit board 12 is marked as D2. In one embodiment, referring to FIG. 3, the orthographic projection area D1 is partially overlapped with the orthographic projection area D2. As the sensor 11 and the receiver 13 is overlapped in the Z direction, there doesn't need an additional carrier between the sensor 11 and the receiver 13 other than the flexible circuit board 12. Therefore, when the electronic assembly 1 is assembled in a main circuit board (not shown), the size for the electronic component 1 in the X direction is saved, optimizing the electronic device 100. In another embodiment, referring to FIG. 4, the orthographic projection area D1 is located in the orthographic projection area D2. In yet another embodiment, the orthographic projection area D1 isn't overlapped with the orthographic projection area D2. For example, the orthographic projection areas D1 and D2 are offset from one another as shown in FIG. 5. The electronic assembly 1 will further be described in the following, taking the electronic assembly 1 in FIG. 3 as an example.

As shown in FIG. 2, the flexible circuit board 12 is used to be electrically connected to the sensor 11, and then flexible circuit board 12 is electrically connected to the main circuit board in the electronic device 100. Thus, electrical signals of the sensor 11 can be transmitted to the main circuit board in the electronic device 100.

In one embodiment, the flexible circuit board 12 may include a first face 121 and a second face 122 opposite to the first face 121.

Figure 6:
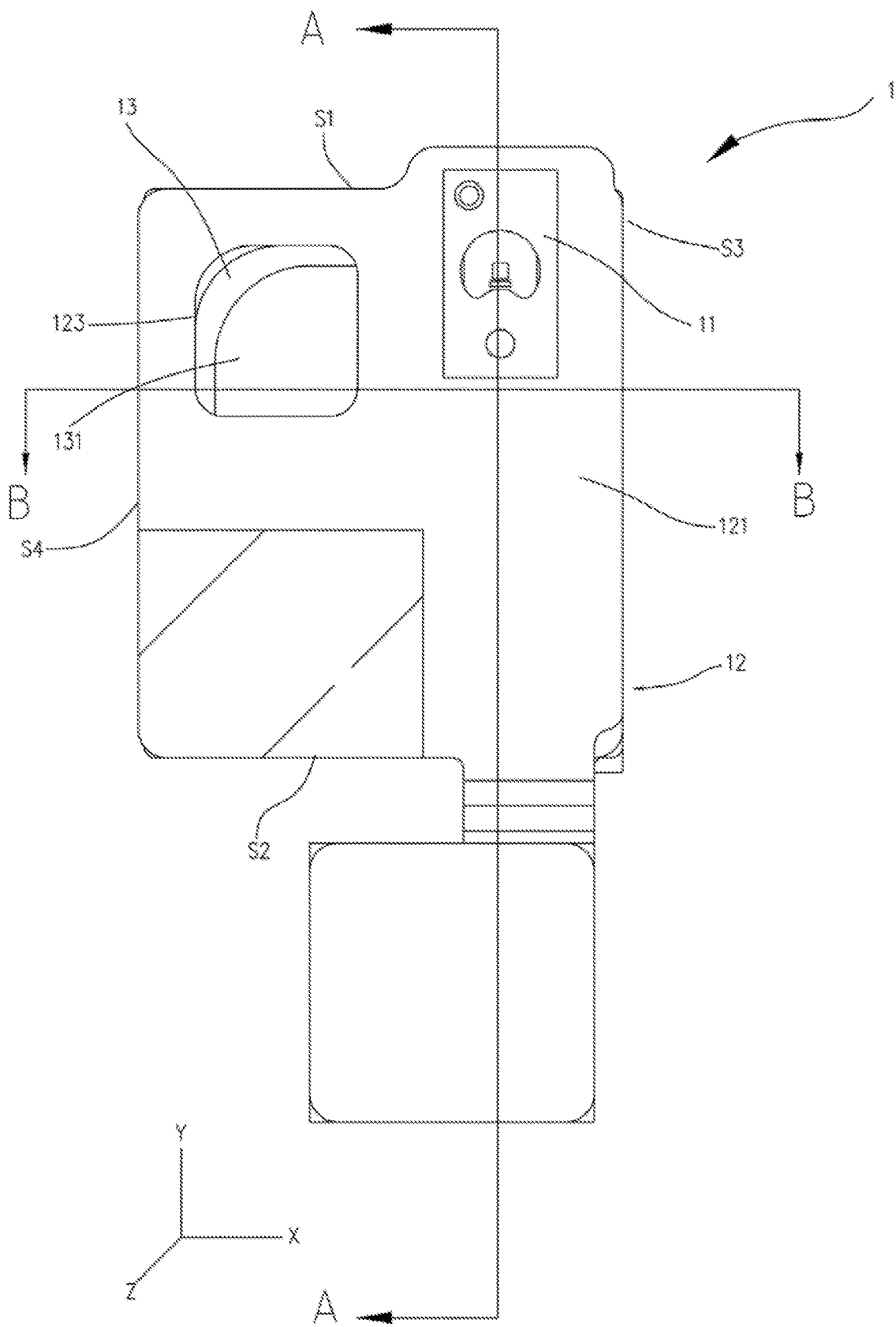
FIG. 6 is a schematic view of the electronic assembly in FIG. 2 according to an embodiment of the present disclosure.

Please referring to FIG. 6 together, which illustrates the electronic assembly 1 same as that in FIG. 3, the first face 121 and the second face 122 are two board surfaces of the flexible circuit board 12, which are disposed opposite to each other. An area of the board surface is large such that various components can be disposed on the flexible circuit board 12.

In one embodiment, the board surface of the flexible circuit board 12 is substantially in a shape of rectangle. Correspondingly, there are four sidewalls on the flexible circuit board 12, which are a first sidewall S1, a second sidewall S2, a third sidewall S3, and a fourth sidewall S4, respectively. The second sidewall S2 is arranged opposite to the first sidewall S2, and the fourth sidewall S4 is arranged opposite to the third sidewall S3. The third sidewall S3 and the fourth sidewall S4 are connected between the first sidewall S1 and the second sidewall S2, respectively. Lengths of the first sidewall S1 and the second sidewall S2 are shorter than that of the third sidewall S3 and the fourth sidewall S4. A part of the second sidewall S2 is protruded along a direction of the third sidewall S3 such that the flexible circuit board 12 is connected to the main circuit board. In one example, the protruded part of the second sidewall S2 is close to the third sidewall S3 as shown in FIG. 6. In this case, the flexible circuit board 12 is arranged in a substantially elongated shape along the Y direction of the electronic device 100, in order to be electrically connected to the main circuit board.

As shown in FIG. 2, the sensor 11 is disposed on the first face 121 of the flexible circuit board 12 and electrically connected to the flexible circuit board 12.

The sensor 11 may include at least one of a distance sensor, a light sensor, and a photoelectric sensor. In this embodiment, the sensor 11 is a light sensor. The light sensor 11 is disposed close to a display screen of the electronic device 100, such that the light sensor 11 can sense lights around the display screen of the electronic device 100 easily. Thus, the brightness of the display screen of the electronic device 100 may be adjusted based on lights sensing by the light sensor 11. As the light sensor 11 can sense lights, an additional hole or structure used for passing through the light isn't needed to be arranged on the electronic device 100. As the light sensor 11 is stacked together with the receiver 13 in the Z direction, it is good for the X direction of the electronic device 100. Thus, the design of the electronic device 100 is optimized.

As shown in FIG. 2, the receiver 13 is disposed on the second face 122 of the flexible circuit board 12.

Figure 13:
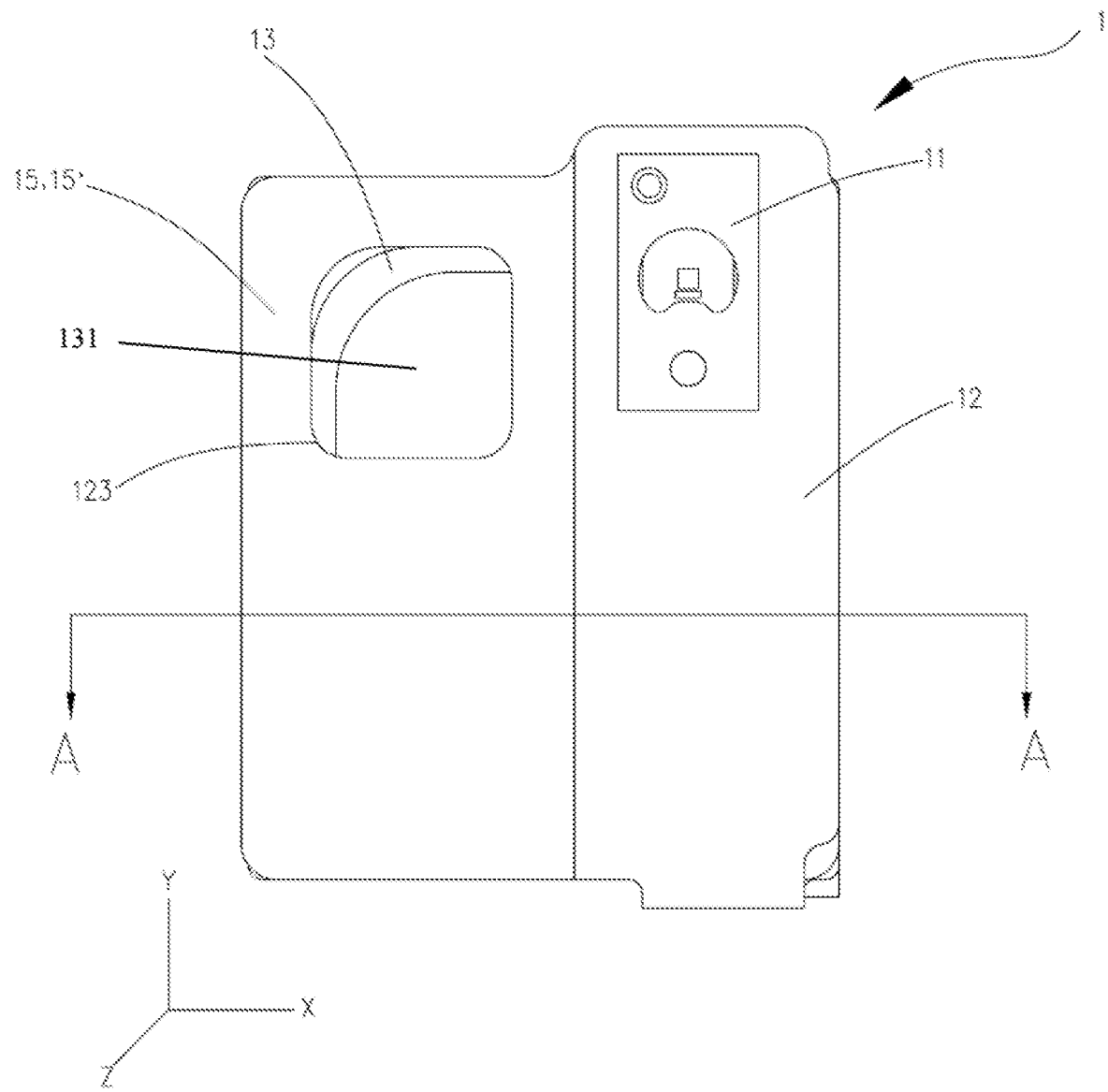
FIG. 13 is a schematic view of an exemplary electronic assembly according to another embodiment of the present disclosure.

The receiver 13 has a substantially rectangular shape, and an intermediate region of the receiver 13 is defined as a vibrating portion 132. As shown in FIG. 6 or FIG. 13, the receiver 13 has a sound channel 131. The sound channel 131 for the receiver 13 may be communicated to outside through the flexible circuit board 12 or bypassing the flexible circuit board 12. The sound channel 131 is used to propagate a sound signal converted from a received audio signal by the receiver 13 to outside. Therefore, the receiving function of the receiver 13 may be achieved.

In one embodiment, please referring to FIGS. 6-12, the sound channel 131 for the receiver 13 is be communicated to outside through the flexible circuit board 12. Thus, the sound signal converted by the receiver 13 may be propagated to outside through the sound channel 131.

As shown in FIGS. 6-12, the receiver 13 is wholly covered with and sealingly connected to the flexible circuit board 12. In this case, the flexible circuit board 12 is not only configured as a part to form the sound channel 131, but also configured as a carrier with which the sensor 11 and the receiver 13 are stacked together. Thus, there doesn't need an additional component for the electronic assembly 1 to stack the sensor 11 and the receiver 13 along the Z direction, and then a thickness of the electronic assembly 1 in the Z direction is reduced.

Figure 7:
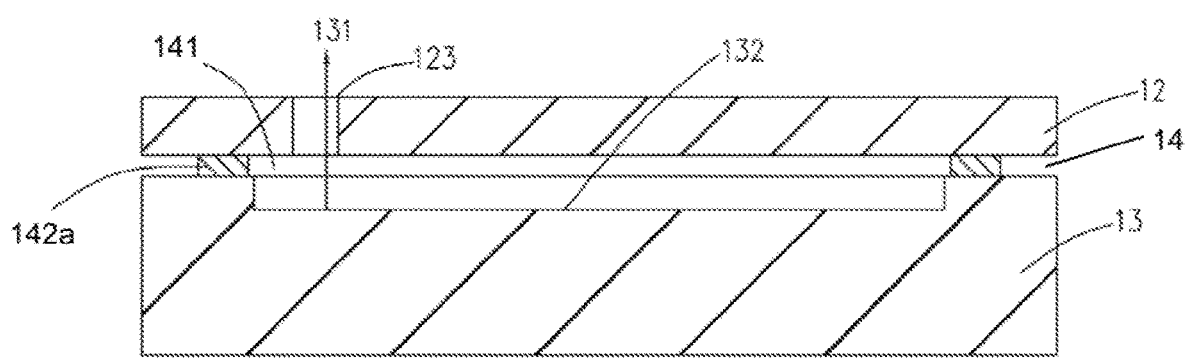
FIG. 7 is a cross-sectional view of an electronic assembly in FIG. 6 along B-B according to one embodiment of the present disclosure.
Figure 8:
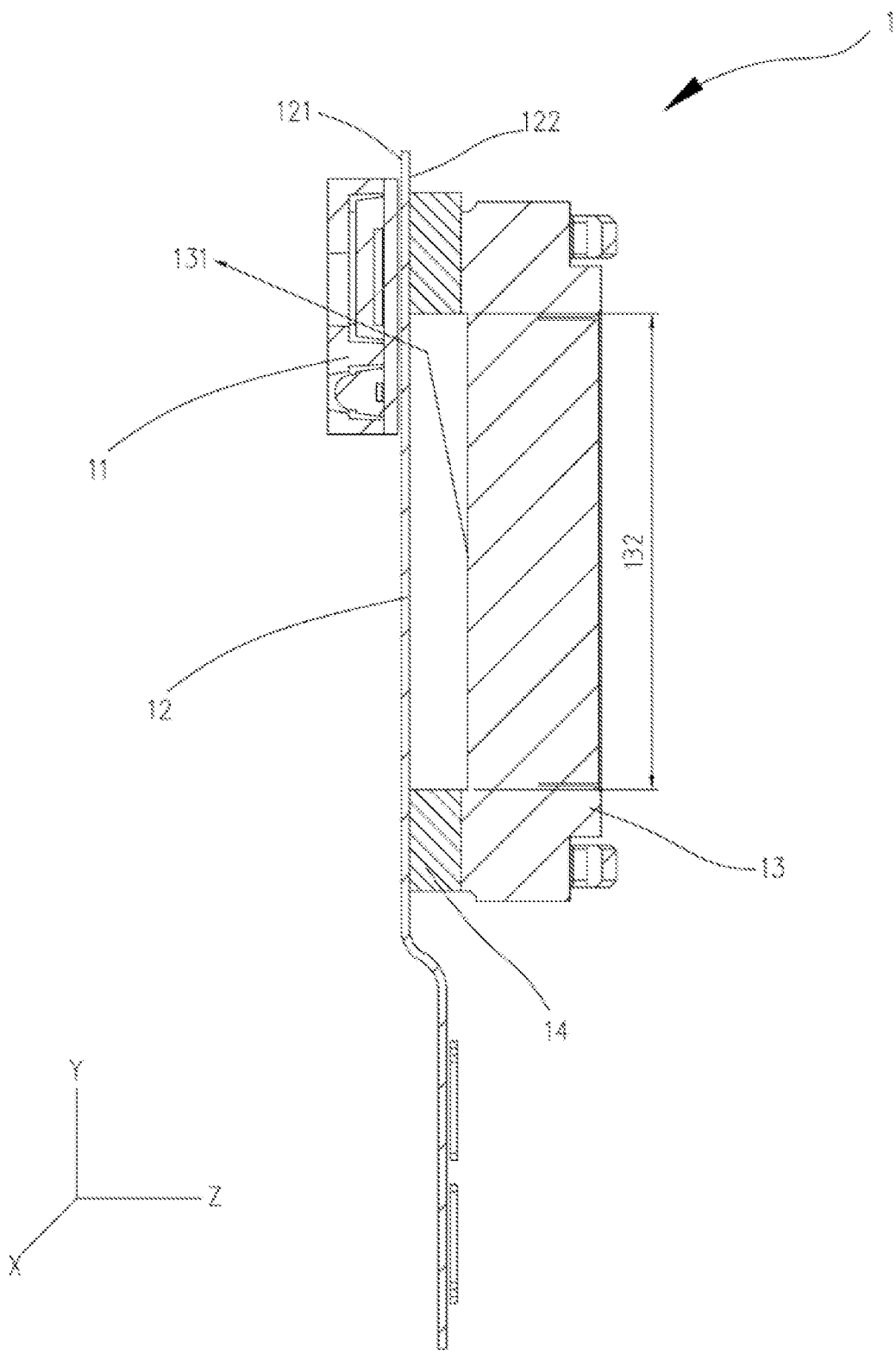
FIG. 8 is a cross-sectional view of the electronic assembly in FIG. 6 along A-A according to another embodiment of the present disclosure.

Please referring to FIGS. 6-8, a receiving hole 123 is defined in the flexible circuit board 12 such that a channel between a vibrating portion 132 of the receiver 13 and the receiving hole 123 is formed as the sound channel 131. As the receiving hole 123 is defined in the flexible circuit board 12 and the channel between a vibrating portion 132 of the receiver 13 and the receiving hole 123 is used as the sound channel 131, the sound channel 131 for the receiver 13 may be communicated to outside through the flexible circuit board 12.

In one example, as shown in FIG. 3, illustrates the electronic assembly 1 same as that in FIG. 6, an area of the second face 122 of the flexible circuit board 12 may be slightly larger than an area of the orthographic projection area D2 of the receiver 13 on the flexible circuit board 12, such that the receiver 13 is totally covered with the flexible circuit board 12. In this case, the flexible circuit board 12 does not occupy too much space in the electronic device 100, and the orthographic projection area D2 of the receiver 13 on the flexible circuit board 12 is located in the second face 122 of the flexible circuit board 12. That is, the receiver 13 is totally covered by the flexible circuit board 12. In other examples, in order to ensure that the receiver 13 is totally covered with the flexible circuit board 12, the area of the second face 122 of the flexible circuit board 12 may be much larger than the area of the orthographic projection area D2 of the receiver 13 on the flexible circuit board 12.

As the receiver 13 is wholly covered with and sealingly connected to the flexible circuit board 12, a vibrating cavity (not labelled) is formed between the vibrating portion 132 of the receiver 13 and the flexible circuit board 12, which is a part of the sound channel 131. When the receiver 13 receives the audio signal, the audio signal is converted to the sound signal by the vibrating portion 132. The sound signal is then propagated through the vibrating cavity to the receiving hole 123. The receiving hole 123 is communicated to the vibrating cavity. Finally, the sound signal is propagated to outside.

Please referring to FIGS. 6-12, the electronic assembly further includes a seal 14. The seal 14 is disposed between the flexible circuit board 12 and the receiver 13 such that the receiver 13 is sealingly connected to the flexible circuit board 12. A hole 141 is defined in the seal 14 to make the sound signals be outputted across the seal 14. Further, the seal 14 may be disposed between the second face 122 of the flexible circuit board 12 and the receiver 13. Thus, as the receiver 13 is sealingly connected to the flexible circuit board 12, the vibrating cavity (not labelled) is formed between the vibrating portion 132 of the receiver 13 and the flexible circuit board 12, which is a part of the sound channel 131. When the receiver 13 receives the audio signals, the audio signal is converted to the sound signals by the vibrating portion 132. The sound signals are then propagated through the vibrating cavity to the seal 14. Due to the hole 141 defined in the seal 14, the sound signals may be propagated across the seal 14 to the receiving hole 123, and then may be outputted from the receiving hole 123 of the flexible circuit board 12.

The seal 14 will be described in detail with reference to various embodiments in the following.

In one embodiment, as shown in FIG. 7, the seal 14 may include a glue line 142a. The glue line 142a is disposed surrounding the vibrating portion 132 such that a space occupied by the disposed glue line 142a is formed as the hole 141. Thus, the sound signals formed by the vibrating portion 132 can be outputted across the seal 14 to outside. The glue line 142a may be used to enhance the sealingly connection between the receiver 13 and the flexible circuit board 12. For example, when the electronic assembly 1 is assembled, the second face 122 of the flexible circuit board 12 is first painted with the glue line 142a surrounding the vibration portion 132, and then the receiver 13 is disposed on the glue line 142a such that the receiver 13 is sealingly connected to the flexible circuit board 12. For another example, when the electronic assembly 1 is assembled, the receiver 13 is first painted with the glue line 142a surrounding the vibration portion 132, and then the receiver 13 with the glue line 142a is disposed on the flexible circuit board 12. For yet another example, when the electronic assembly 1 is assembled, both the receiver 13 and the second face 122 of the flexible circuit board 12 are painted with the glue line 142a surrounding the vibration portion 132, and then the receiver 13 with the glue line 142a is disposed on the glue line 142a on the second face 122 of the flexible circuit board 12.

Due to the glue line 142a, it ensures that the seal 14 has a small thickness. Thus, a size for the electronic device 100 in the Z direction is reduced as the sensor 11, the flexible circuit board 12, the receiver 13 and the seal 14 are disposed in the Z direction.

Figure 9:
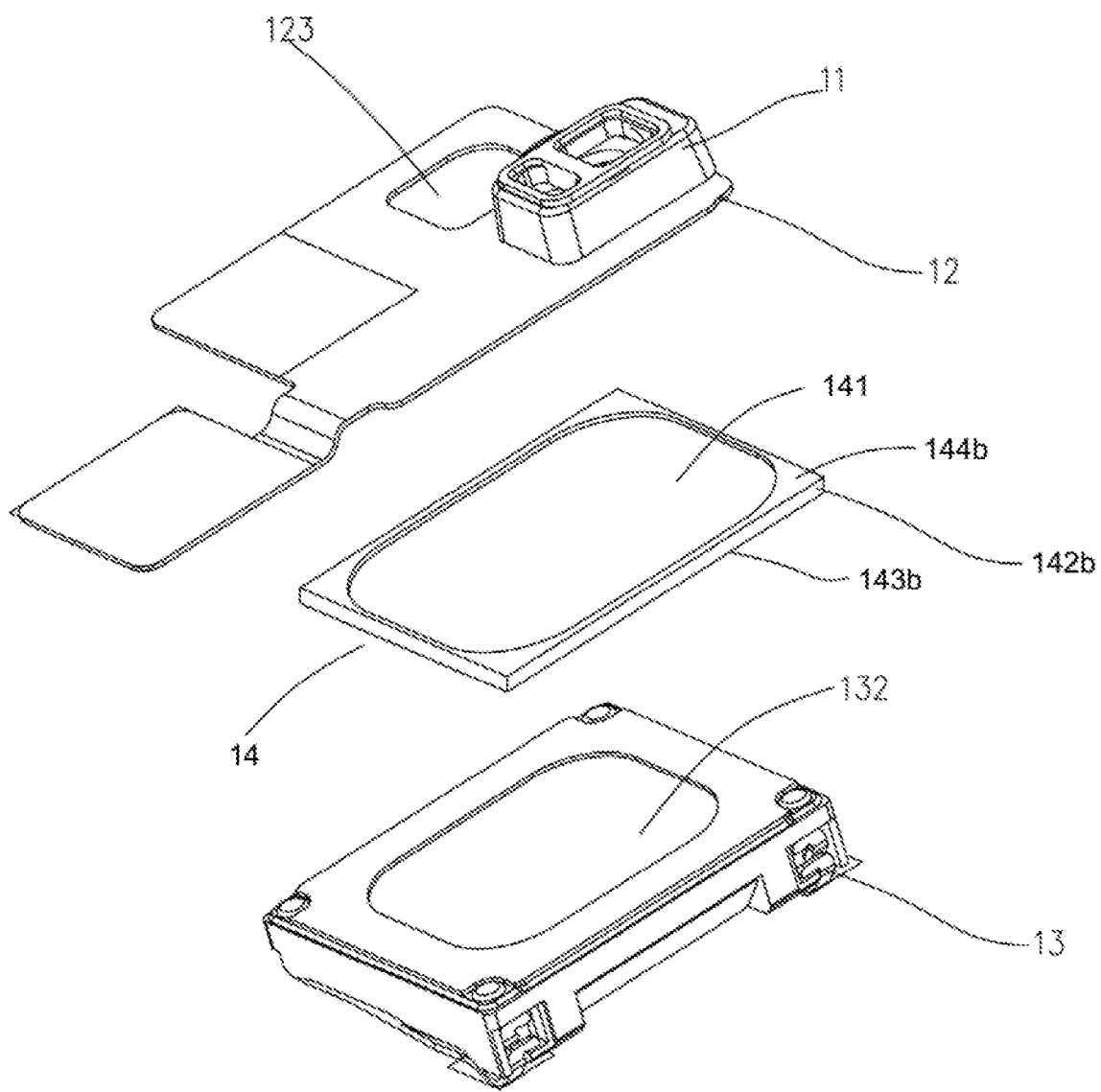
FIG. 9 is an exploded view of the electronic assembly shown in FIG. 8.

In another embodiment, please referring to FIGS. 8-9, the seal 14 may include a foam 142b, a first glue line 143b and a second glue line 144b. The foam 142b is hollowed out such that the hole 141 is formed. The first glue line 143b and the second glue line 144b are disposed on two opposite faces of the hollowed foam 142b, respectively.

Since the foam 142b has elasticity, the electronic assembly 1 can be adjusted adaptively in the Z direction when the electronic assembly 1 is assembled into the electronic device 100. Further, as the foam 142b is used to make the receiver 13 sealingly be connected to the flexible circuit board 12, the sound signals cannot leak from the foam 142b, and can be outputted better.

Figure 10:
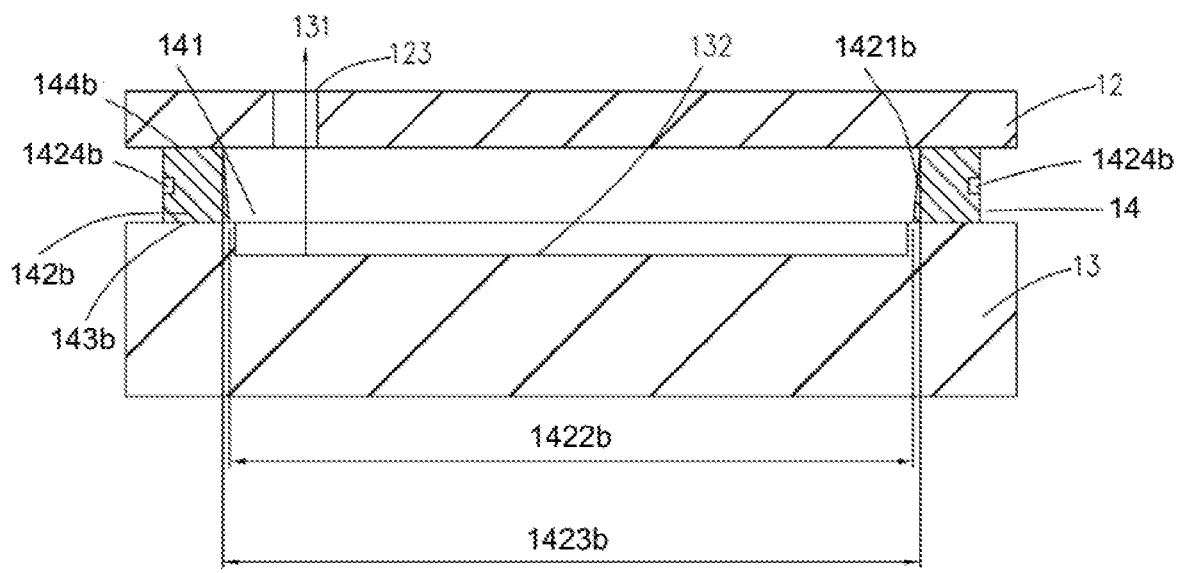
FIG. 10 is a cross-sectional view of a seal in FIG. 8 according to an example of the present disclosure.
Figure 11:
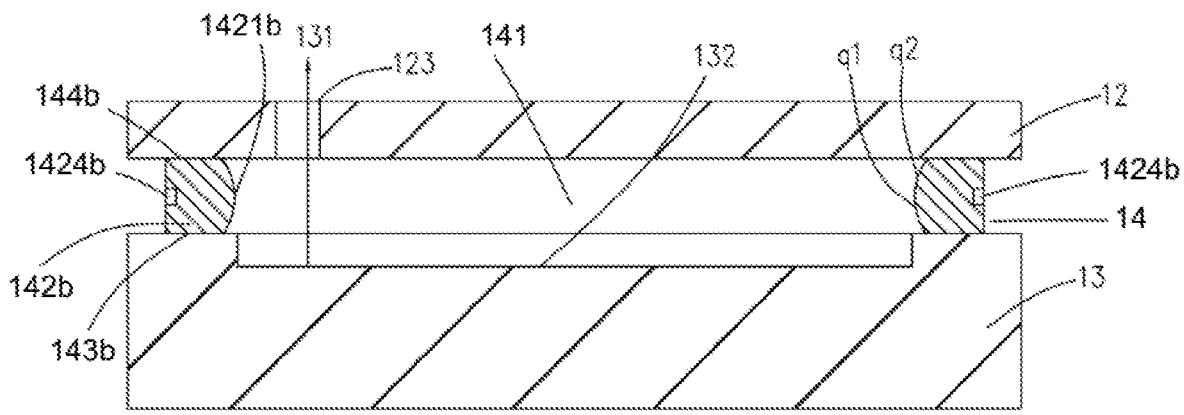
FIG. 11 is a cross-sectional view of a seal in FIG. 8 according to another example of the present disclosure.
Figure 12:
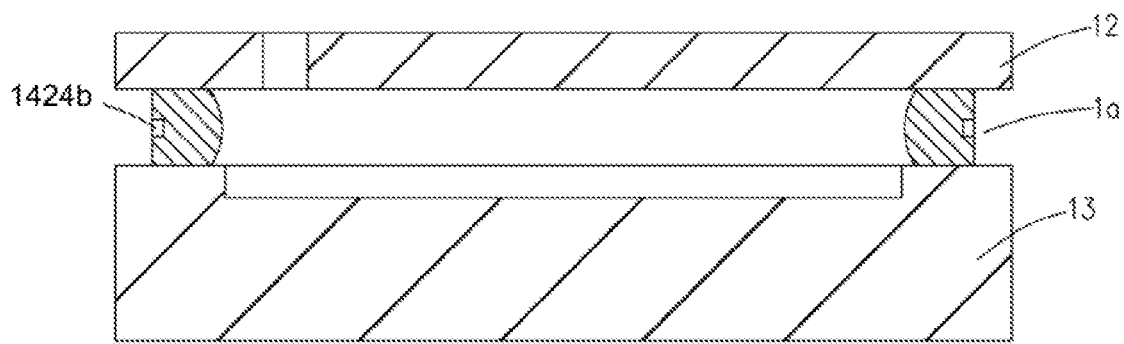
FIG. 12 is a cross-sectional view of the seal in FIG. 11, where a socket is illustrated.

In one example, please referring to FIGS. 10-12, an area where the vibrating portion 132 of the receiver 13 is located is located in an orthographical projection area of the inner wall of the hollowed foam 142b on the receiver 13. That is, a size of the hole 141 of the hollowed foam 142b is larger than a size of the vibrating portion 132 of the receiver 13. In this way, the sound signals can all pass through the hole 141 of the hollowed foam 142b, and none of them is blocked to be outputted across the seal 14. In another example, the area where the vibrating portion 132 of the receiver 13 is located may overlap with the area orthographical projection area of the inner wall of the hollowed foam 142b on the receiver 13.

Further, in one example, please referring to FIG. 10, the inner wall 1421b of the hollowed foam 142b is tapered. The tapered inner wall 1421b of the hollowed foam 142b has different apertures, which include the apertures 1422b and 1423b. In order to better output the sound signals from the receiver 13, values of the apertures of the tapered inner wall 1421b are increased in a direction from the vibration portion 132 of the receiver 13 to the flexible circuit board 12. That is, a value of the aperture 1422b is smaller than a value of the aperture 1423b. As the apertures are increased in a direction from the vibration portion 132 of the receiver 13 to the flexible circuit board 12, the sound signals to be outputted becomes aloud. Therefore, the sound performance for the receiver 13 is improved without varying the vibrating portion 132 of receiver 13.

In another example, please referring to FIGS. 11-12, the inner wall 1421b of the hollowed foam 142b is curved. The curved inner wall 1421b consists of a first arc surface q1 and a second arc surface q2 connected together. The curved inner wall 1421b of the hollowed foam 142b has different apertures. In order to better output the sound signal from the receiver 13, values of the apertures of the curved inner wall 1421b are first increased and then decreased in a direction from the vibration portion 132 of the receiver 13 to the flexible circuit board 12. That is, a value of an aperture for a connection where the first arc surface q1 and the second arc surface q2 are connected is smallest among the values of the apertures of the curved inner wall 1421b. In this way, the sound signals to be outputted becomes weakened first, and then becomes enhanced. Thus, the sound signal to be outputted becomes aloud. Therefore, the sound performance for the receiver 13 is improved without varying the vibrating portion 132 of receiver 13.

As shown in FIGS. 10-12, an orthographical projection area of an outer wall (not labelled) of the hollowed foam 142b on the receiver 13 is located in an area for the receiver 13, and the orthographical projection area of the outer wall of the hollowed foam 142b on the flexible circuit board 12 is located in an area for the flexible circuit board 12. In this way, a socket 1a is formed. That is, a size (e.g. length or width) of the hollowed foam 142b is smaller than sizes for the receiver 13 and the flexible circuit board 12. Due to the socket 1a, the electronic assembly 1 can be assembled into the electronic device 100 easily.

Further, as shown in FIGS. 10-12, a limiting slot 1424b is defined in the outer wall of the hollowed foam 142b. In one example, the limiting slot 1424b is a ring slot. With the limiting slot 1424b, the electronic assembly 1 can be fixed. Thus, the hollowed foam 142b is not only used to make the receiver 13 and the flexible circuit board 12 be sealingly connected together, but also used to make the electronic assembly 1 be fixed in the electronic device 100. Correspondingly, a protrusion (not shown) is defined in the electronic device 100. The electronic assembly 1 is fixed when the protrusion is inserted into the limiting slot 1424b.

When the electronic assembly 1 is assembled into the electronic device 100, the protrusion is embedded into the socket 1a, and then inserted into the limiting slot 1424b. Thus, the electronic assembly is better fixed. And due to the socket 1a, the protrusion is provided with spaces to be embedded. Therefore, a size for the electronic device 100 in Z direction is reduced.

Figure 14:
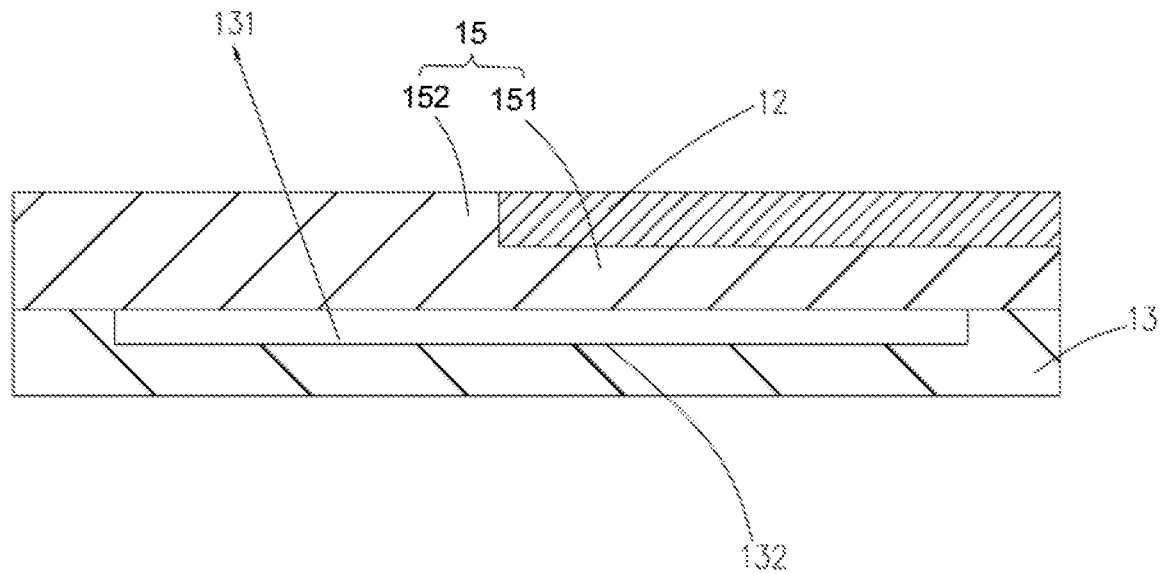
FIG. 14 is a sectional view of the electronic assembly in FIG. 13 along A-A according to an embodiment of the present disclosure.
Figure 15:
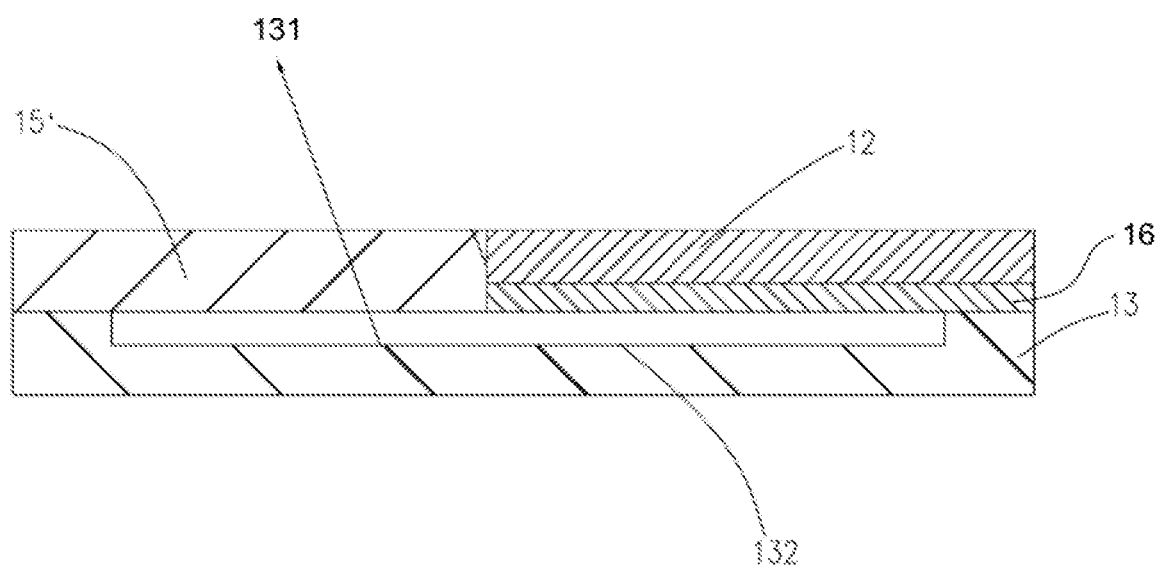
FIG. 15 is a sectional view of the electronic assembly in FIG. 13 along A-A according to another embodiment of the present disclosure.

In another embodiment, please referring to FIGS. 13-15, the sound channel 131 for the receiver 13 is communicated to outside bypassing the flexible circuit board 12. Thus, the sound signal converted by the receiver 13 may be propagated to outside through the sound channel 131.

As shown in FIGS. 13-15, the electronic assembly 1 may also include a seal 15 or 15'. The seal 15 or 15' and/or the flexible circuit board 12 are together configured to make the receiver 13 covered wholly. The receiving hole 123 is defined in the seal 15 or 15' such that a channel between the vibrating portion 132 of the receiver 13 and the receiving hole 123 is formed as the sound channel 131. As the receiving hole 123 is defined in the seal 15 or 15', the sound signal is propagated to outside through the seal 15 or 15'. That is, the sound signal is propagated to outside bypassing the flexible circuit board 12.

In this embodiment, the seal 15 or 15' makes the electronic assembly 1 more practical, and makes the size of the flexible circuit board 12 reduced, further optimizing the design of electronic device 100.

In one example, as shown in FIG. 13, an area of the first face 122 of the flexible circuit board 12 may be nearly same as an area of the orthographic projection area D1 of the sensor 11 on the flexible circuit board 12. That is, the size of the flexible circuit board 12 is nearly same as the size of the sensor 11 in the X-Y plane. In this case, the flexible circuit board 12 does not occupy too much space in the electronic device 100. Thus, the flexible circuit board 12 is totally covered by the sensor 11.

A horizontal area (in the X-Y plane) of the seal 15 or 15' and the flexible circuit board 12 may be nearly same as a horizontal area of the receiver 13. In one example, the seal 15 or 15' is substantially foam with a shape of cuboid. In another example, the seal 15 or 15' is a reinforcing plate. The reinforcing plate is made of metal, or plastic, etc.

As the receiver 13 is wholly covered with and sealingly connected to the seal 15 or 15' and/or the flexible circuit board 12, a vibrating cavity (not labelled) is formed between the vibrating portion 132 of the receiver 13 and the flexible circuit board 12 and the seal 15 or 15', which is a part of the sound channel 131. When the receiver 13 receives the audio signal, the audio signal is converted to the sound signal by the vibrating portion 132. The sound signal is then propagated through the vibrating cavity to the receiving hole 123. The receiving hole 123 is communicated to the vibrating cavity. Then the sound signal is propagated to outside.

The seal 15 or 15' will be described in the following in detail.

In one example, referring to FIGS. 13-14, which illustrates the seal 15, the seal 15 is configured to make the receiver 13 wholly covered on its own. The seal 15 includes a first sealing portion 151 and a second sealing portion 152 connected to the first sealing portion 151. The first sealing portion 151 is sealingly connected to a part of the receiver 13, and the second sealing portion 152 is covered with and sealingly connected to remaining part of the receiver 13. The receiving hole 123 is defined in the second sealing portion

152. Thus, the channel between a vibrating portion 132 of the receiver 13 and the receiving hole 123 is formed as the sound channel 131 for the receiver 13. The flexible circuit board 12 is disposed on the first sealing portion 151.

The first sealing portion 151 and the second sealing portion 152 are vertically connected as a whole. A cross section of the seal 15 is substantially in a L-shape. A thickness of the first sealing portion 151 is less than that of the second sealing portion 152. The thickness of the second sealing portion 152 is almost equal to a sum of the thickness of the first sealing portion 151 and a thickness of the flexible circuit board 12. Thus, as the flexible circuit board 12 is fixedly disposed on the first sealing portion 151, a surface of the second sealing portion 152 is in the same plane as that of the flexible circuit board 12. In a case where the seal 15 is foam, the flexible circuit board 12 is directly sealingly connected to the part of the receiver 13 via the first sealing portion 151 without any additional sealing elements. The seal 15 is directly sealingly connected to the remaining parts of the receiver 13 via the second sealing portion 152 without any additional sealing elements. Thus, the design of the electronic assembly 1 is optimized.

In another example, referring to FIGS. 13 and 15, which illustrates the seal 15', the seal 15' is bonded to a sidewall of the flexible circuit board 12. Thus, the seal 15' is spliced to the flexible circuit board 12.

The seal 15' has a shape of cuboid. The seal 15' is directly bonded to the sidewall of the flexible circuit board 12. In a case where the seal 15' is foam, the seal 15' is directly sealingly connected to the remaining parts of the receiver 13 without any additional sealing elements. A sealing element 16, for example foam, is needed to be disposed between the flexible circuit board 12 and the receiver 13, so that the flexible circuit board 12 is sealingly connected to the part of the receiver 13. Thus, both the seal 15' and the flexible circuit board 12 are sealingly connected to the receiver 13, and then the vibrating cavity is formed between the vibrating portion 132 of the receiver 13 and the flexible circuit board 12 and seal 15'.

Figure 17:
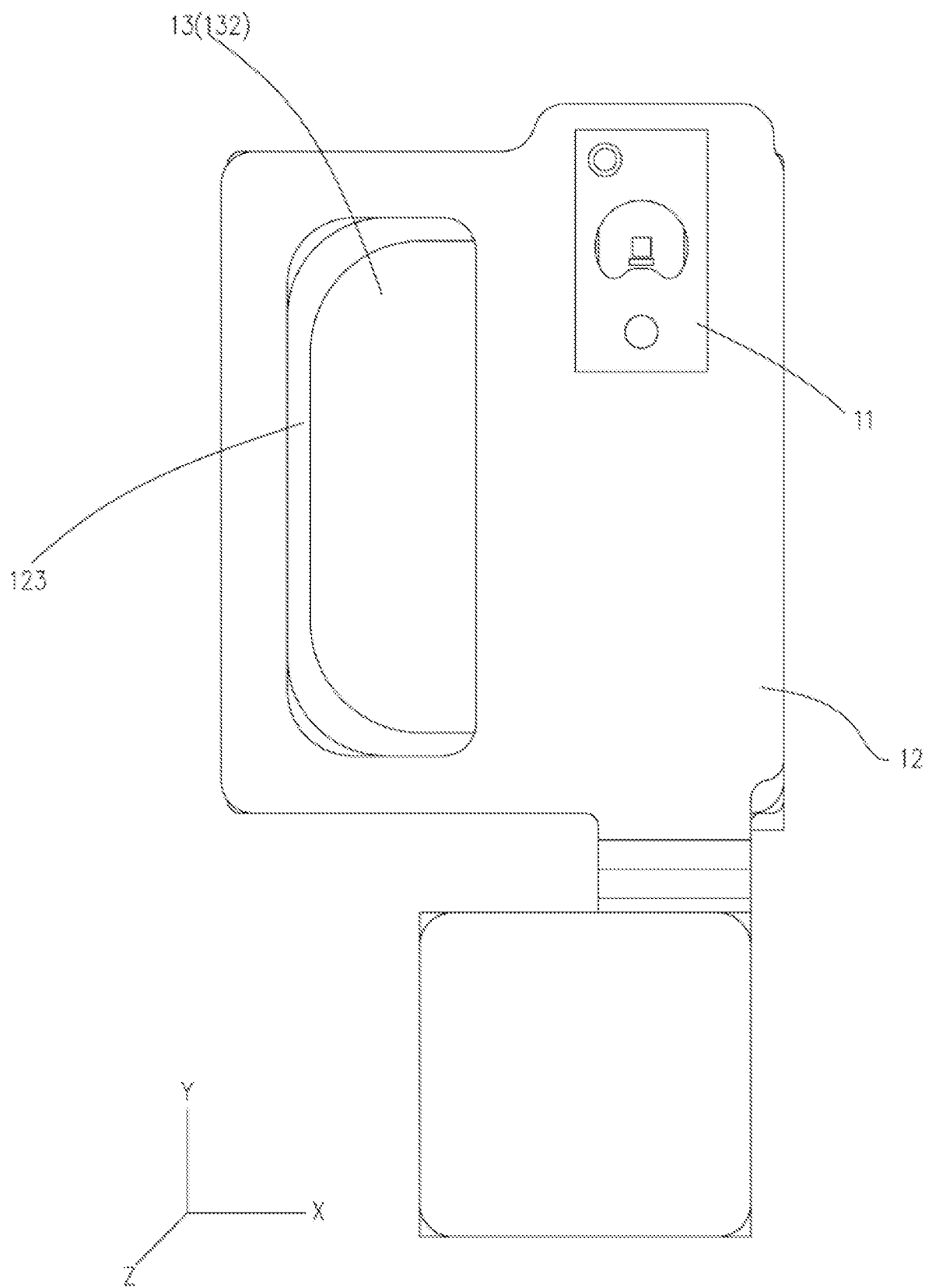
FIG. 17 is a schematic view illustrating a relative relationship between a receiving hole and a vibrating portion of an electronic assembly according to another example.
Figure 18:
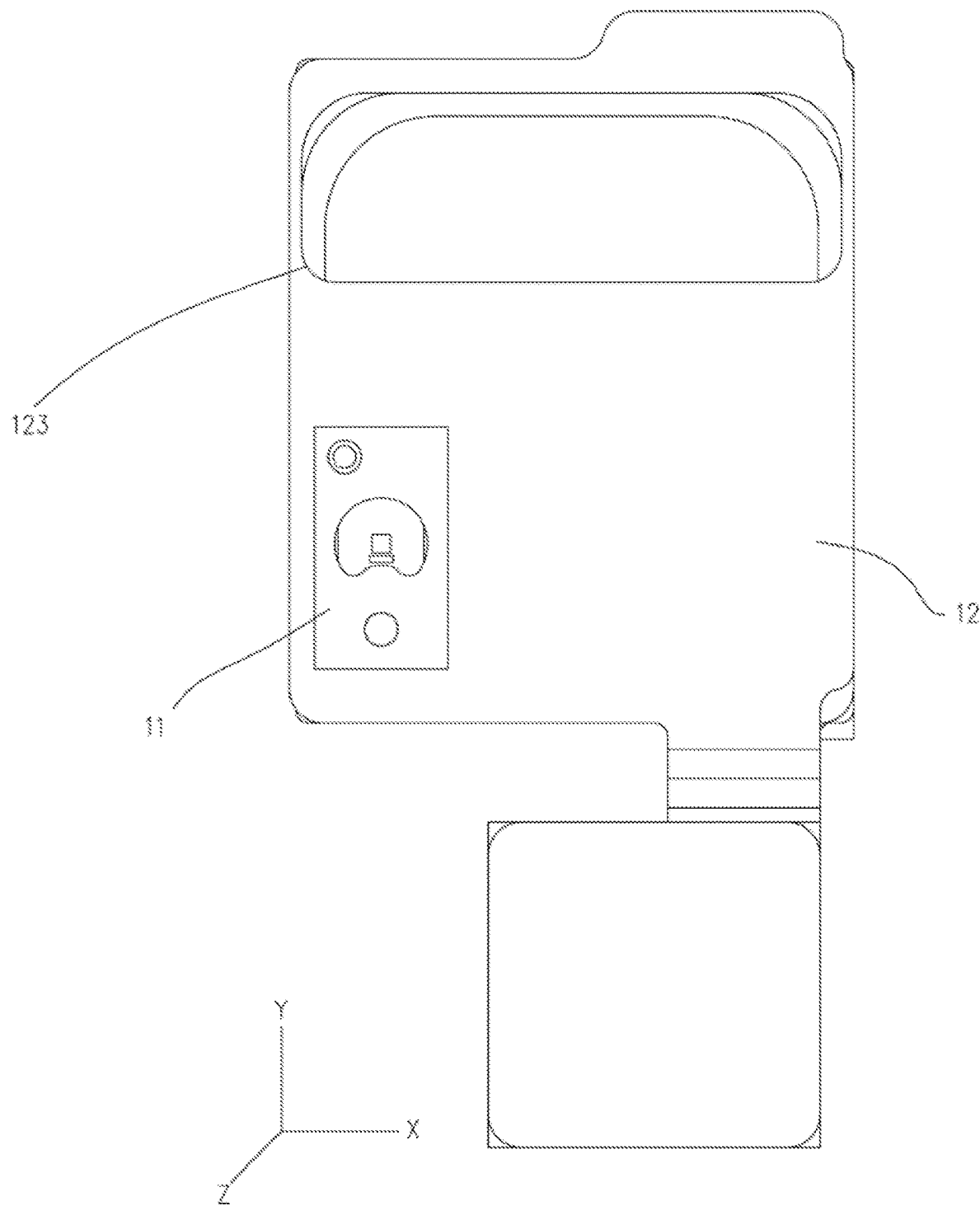
FIG. 18 is a schematic view illustrating a relative relationship between a receiving hole and a vibrating portion of an electronic assembly according to yet another example.

The sensor 11 and the receiving hole 123 may be arranged on the flexible circuit board 12 in different designs, which will be described in the following with reference to FIGS. 16-18.

Figure 16:
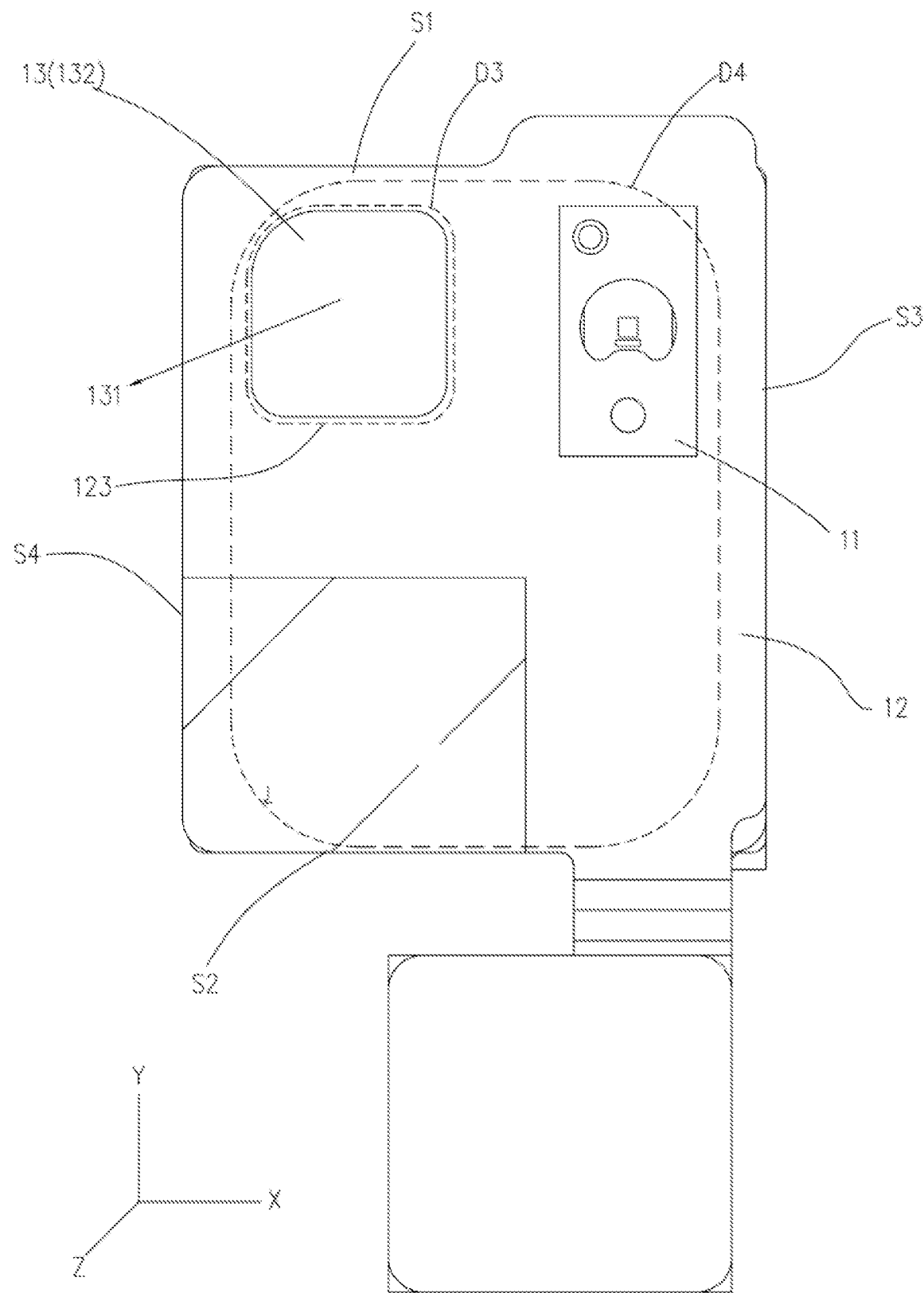
FIG. 16 is a schematic view illustrating a relative relationship between a receiving hole and a vibrating portion of the electronic assembly in FIG. 2 according to an example.

In one embodiment, referring to FIG. 16 together with FIG. 4, the sensor 11 is disposed at a corner formed by the first sidewall S1 and the third sidewall S3. The corner formed by the first sidewall S1 and the third sidewall S3 is far away from the protruded part of the second sidewall S2. That is, the sensor 11 is disposed near a connection between the first sidewall S1 and the third sidewall S3 of the flexible circuit board 12, and far away from the main circuit board. In this case, as the electronic assembly 1 is assembled into the electronic device 100, the sensor 11 is close to a top side of the electronic device 100, thereby reducing the size of the non-display area of the electronic device 100.

Please referring to FIG. 16, both the receiving hole 123 and the sensor 11 are arranged close to the first sidewall S1. In one example, the receiving hole 123 is disposed close to a corner formed by the first sidewall S1 and the fourth sidewall S3 as shown in FIG. 16. In this case, since the sensor 11 is disposed at a corner formed by the first sidewall S1 and the third sidewall S3, the receiving hole 123 and the sensor 11 are arranged side by side along a direction of first sidewall S1, reducing the non-display area of the electronic device 100 as the electronic assembly 1 is assembled into the electronic device 100. Thus, the screen ratio of the electronic device 100 can be improved.

Further, as shown in FIG. 16, an orthographical projection area of an inner wall of the receiving hole 123 on the receiver 13 is overlapped with a part of an area where a vibrating portion 132 of the receiver 13 is located. Thus, as the channel between the vibrating portion 132 and the receiving hole 123 is used as the sound channel 131, the receiving hole 123 faces to a part of the vibrating portion 132. To ensure output of the sound signal from the receiver 13, a sound guide structure may be additionally needed to be covered over the receiving hole 123. As shown in FIG. 16, an orthographic projection area of the inner wall of the receiving hole 123 on the flexible circuit board 12 is marked as D3, and an orthographic projection area of vibrating portion 132 of the receiver 13 on the flexible circuit board 12 is marked as D4. The orthographic projection area D3 is located in the orthographic projection area D4. That is, a size of the receiving hole 123 is less than that of the vibrating portion 132 of the receiver 13. For example, as shown in FIG. 16, the size of the receiving hole 123 may be about a quarter of the size of the vibrating portion 132. That is, the orthographic projection area D3 is about a quarter of the orthographic projection area D4. As another example, as shown in FIG. 17, the size of the receiving hole 123 may be about half of the size of the vibrating portion 132.

In another embodiment, the receiving hole 123 may be arranged in a different direction from the sensor 11. As shown in FIG. 18, the sensor 123 is disposed close to a corner formed by the fourth sidewall S4 and the second sidewall S2. The receiving hole 123 is disposed along the first sidewall S1. In this case, the size of the receiving hole 123 is about half of the size of the vibrating portion 132.

Please referring to FIG. 1 again, the electronic device 100 may also include a display module 2. The display module 2 has a display area, which is marked with Z1, and a non-display area marked with Z2. The display area Z1 is configured to display electronic images, and the non-display area Z2 is configured to non-display electronic images. A receiving window 21a is defined in the non-display area Z2. The display module 2 is connected to a housing (not labelled) of the electronic device 100, such that an internal cavity (not labelled) is formed. The electronic assembly 1 is received in the internal cavity. Correspondingly, the electronic assembly 1 is located in the non-display area 72 as the electronic assembly 1 is received in the internal cavity.

Figure 19:
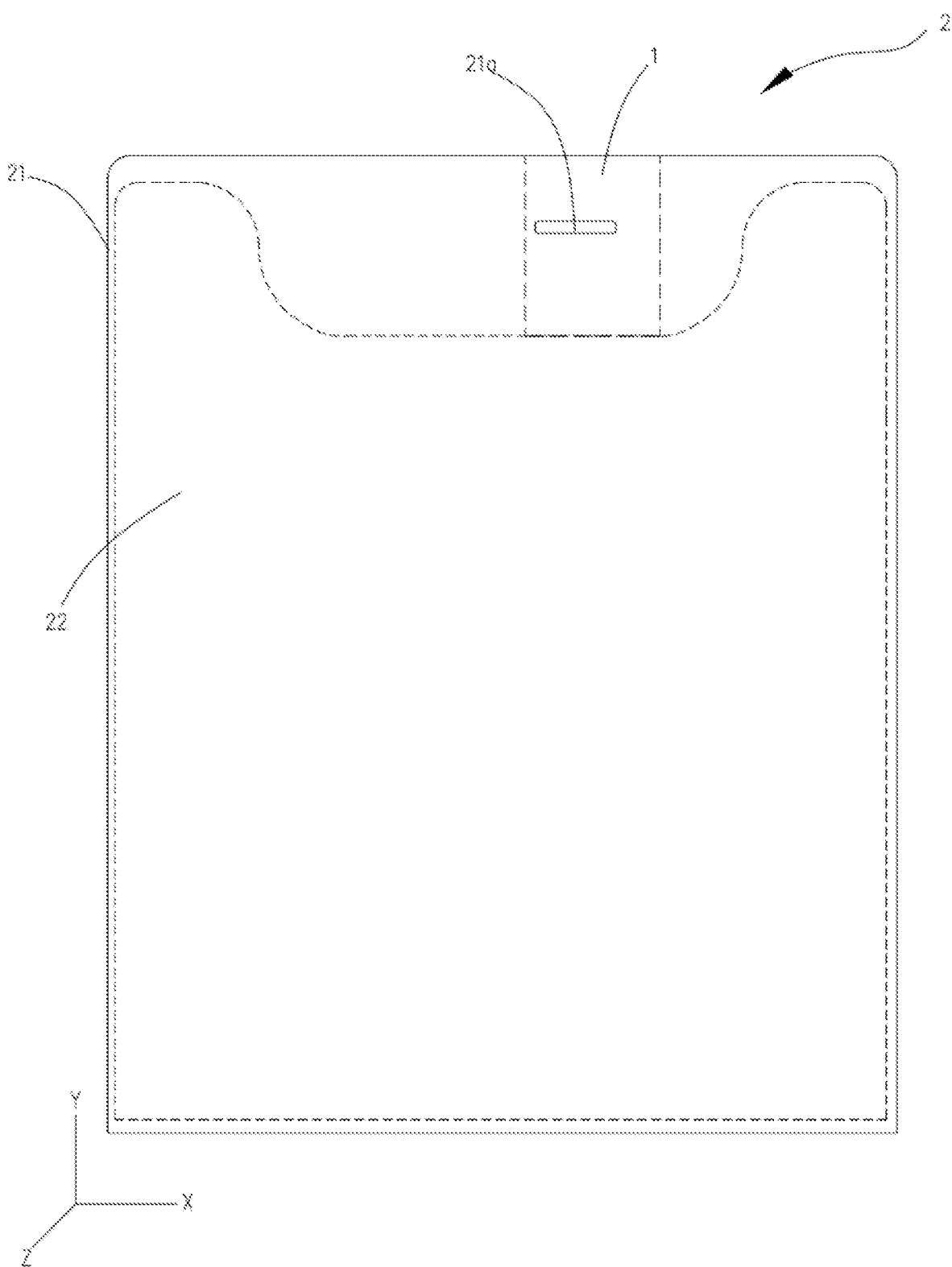
FIG. 19 is a schematic view of a display module of the electronic device in FIG. 1.
Figure 20:
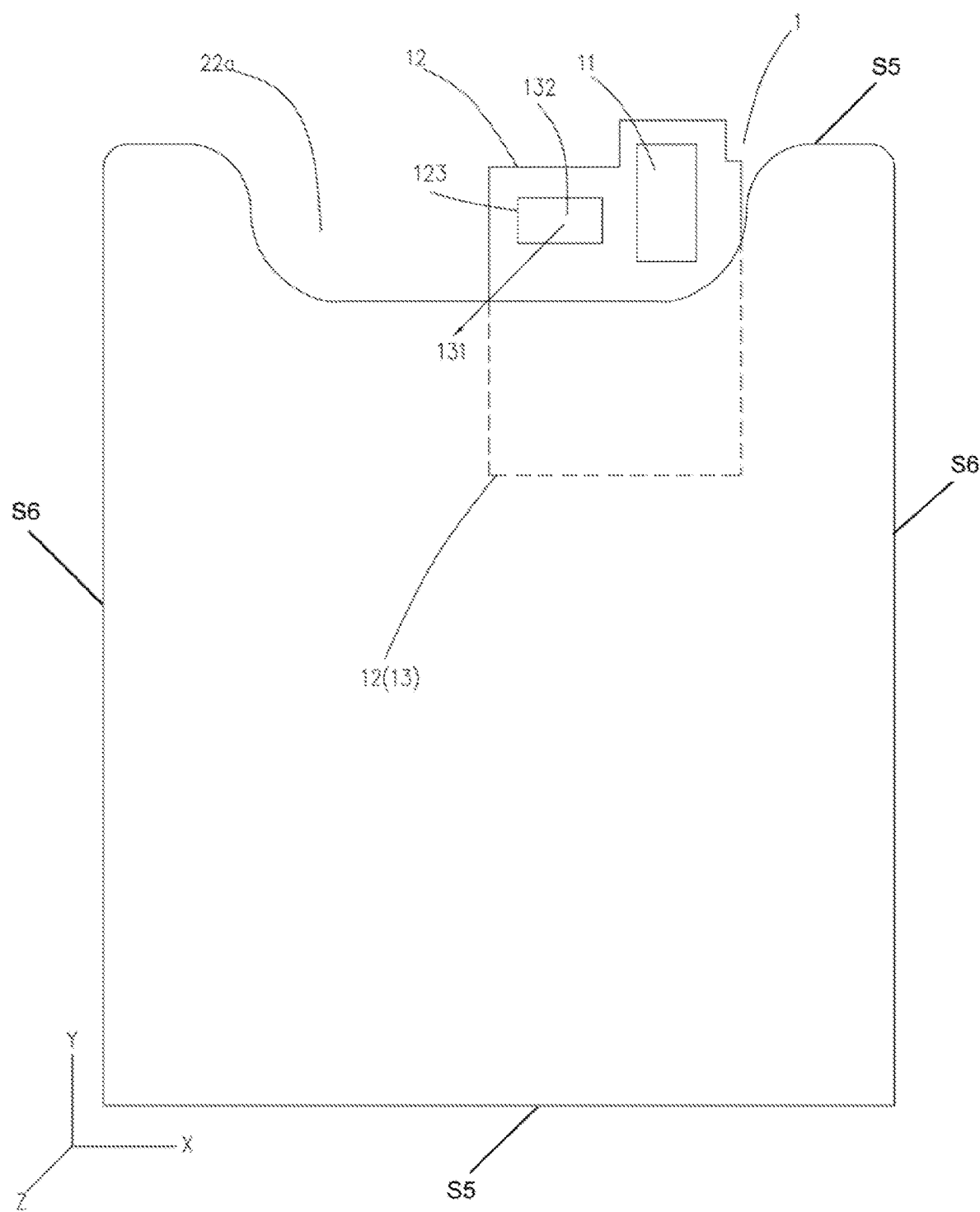
FIG. 20 is a schematic view of a display assembly of the display module in FIG. 19 according to an example.

Please referring to FIGS. 19-20 together, the electronic assembly 1 faces to the display module 2. In specific, at least one part of the sensor 11 and at least one part of the receiver 13 are located in the non-display area Z2. For the receiver 13, an orthographic projection area of the receiver 13 on the display module 2 is at least partly located in the non-display area Z2, further reducing the size of the non-display area Z2 in the Y direction. Therefore, the size of the display area Z1 may be increased, and the screen ratio of the electronic device 100 may be further improved. For the sensor 11, an orthographic projection area of the sensor 11 on the display module 2 is at least partly located in the non-display area Z2.

As shown in FIG. 20, the sound channel 131 is communicated to the receiving window 21a. That is, the receiving hole 123 faces to the non-display area Z2. Thus, the sound signal from the receiver 13 can be propagated to the receiving window 21a, so that users can listen to the sound signal through the receiving window 21a. Further, the first face 121 of the flexible circuit board 12 faces to the display module 2 such that the sensor 11 faces to the non-display area Z2. Thus, in a case where the sensor 11 is a light sensor, the sensor 11 can receive lights.

Please referring to FIGS. 19-20 together, the display module 2 includes a cover plate 21 and a display assembly 22 stacked with the cover plate 21.

The electronic assembly 1 and the display module 2 are assembled as follows: the electronic assembly 1 is stacked as described above, and then the first face 121 of the flexible circuit board 12 faces to the display assembly 22. the electronic assembly 1 is then arranged against the display module 2. Thus, the receiving hole 123 and the sensor 11 face to the non-display area Z2. Therefore, the sound signal from the receiver 13 can be propagated to the receiving window 21a via the receiving hole 123, and the sensor 11 receives lights to operate.

Please referring to FIGS. 19-20 together, the display assembly 22 has two short sidewalls S5, which are opposite to each other, and two long sidewalls S6 opposite to each other. The two long sidewalls S6 are connected between the two short sidewalls S5, respectively. One of the two short sidewalls S5 is recessed toward the other one. Thus, a groove 22a is formed as the display assembly 22 is recessed. A projection area of the recessed display assembly 22 on the cover plate 21 is defined as the display area Z1, and a non-projection area of the recessed display assembly 22 on the cover plate 21 is defined as the non-display area Z2. That is, a whole area of the recessed display assembly 22 is used as the display area Z1, and an area of the groove 22a is used as the non-display area Z2. Since the sensor 11, the flexible circuit board 12 and the receiver 13 are sequentially stacked in the Z direction of the electronic device 100, the area of the groove 22a in the X direction is reduced. Thus, the display area Z1 can be increased, and the screen ratio of the electronic device 100 is increased.

Please referring to FIGS. 19-20 together, the receiving window 21a is defined on the cover plate 21. The receiving window 21a defined on the cover plate 21 is corresponds to the receiving hole 123. That is, the receiving window 21a is aligned with the receiving hole 123. For example, the receiving window 21a is in a shape of rectangle, and a length of the receiving window 21a is approximately twice as large as that of the receiving hole 123 in the direction of the short sidewall S5. That is, a ratio of the lengths of the receiving window 21a and the receiving hole 123 in the direction of the short sidewall S5 is 2:1. As a further example, a ratio of the lengths of the receiving window 21a and the receiving hole 123 in the direction of the short sidewall S5 is 3:1 or 4:1.

In one example, as shown in FIG. 20, the groove 22a is formed as the middle of one short sidewall S5 is recessed to the other one, so that the non-display area Z2 is located at the middle of a side of the cover plate 21. That is, the groove 22a is located at the middle of the side of the cover plate 21.

Figure 21:
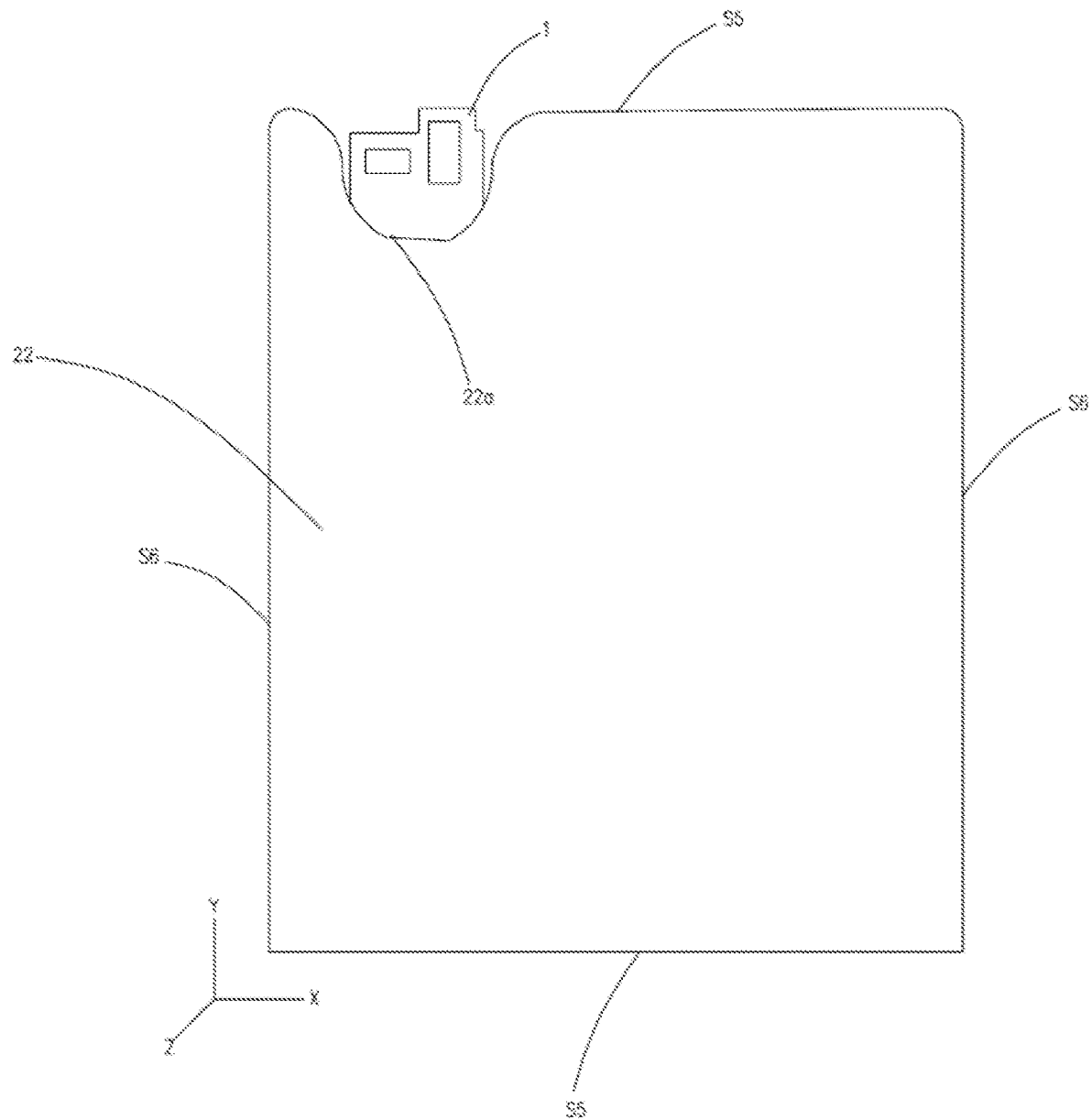
FIG. 21 is a schematic view of a display assembly of a display module according to another example.
Figure 22:
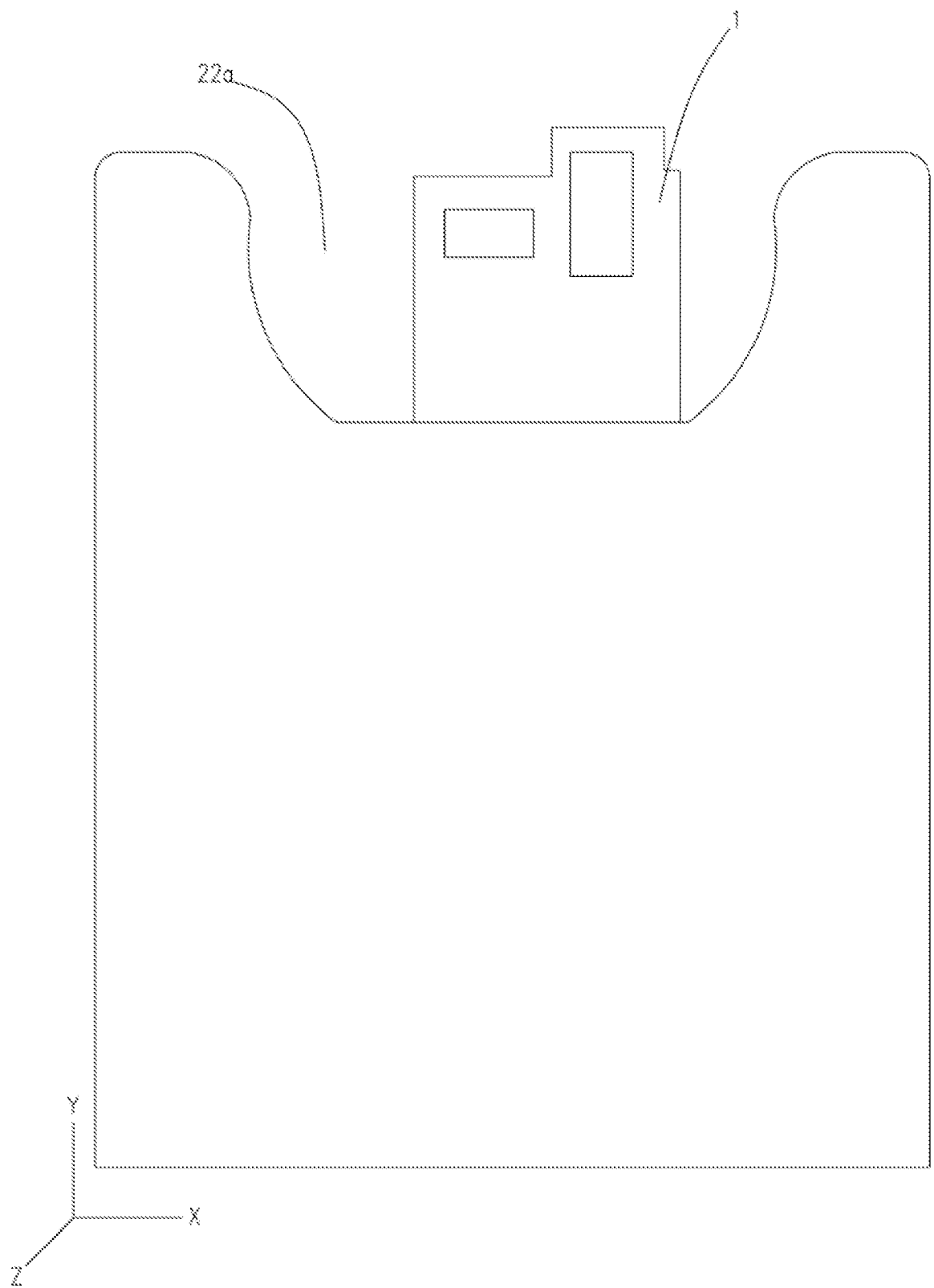
FIG. 22 is a schematic view of a display assembly of a display module according to yet another example.

In another example, as shown in FIG. 21, the groove 22a is formed as an end of one short sidewall S5 is recessed to the other one, so that the non-display area Z2 is located at a corner of the cover plate 21. That is, the groove 22a is located at the corner of cover plate 21.

As described above, at least one part of the sensor 11 and at least one part of the receiver 13 are located in the non-display area Z2. In one example, as shown in FIG. 20, parts of the sensor 11 and the receiver 13 are located in the groove 22a, which corresponds to the non-display area Z2, and remaining parts of the sensor 11 and the receiver 13 overlaps with the recessed display assembly 22 corresponding to the display area Z1. Thus, a length of the non-display area Z2 in the Y direction may be further reduced, and the screen ratio of the electronic device 100 may be further improved. In another example, referring to FIG. 22, the electronic assembly 1 is totally located in the groove 22a.

Figure 23:
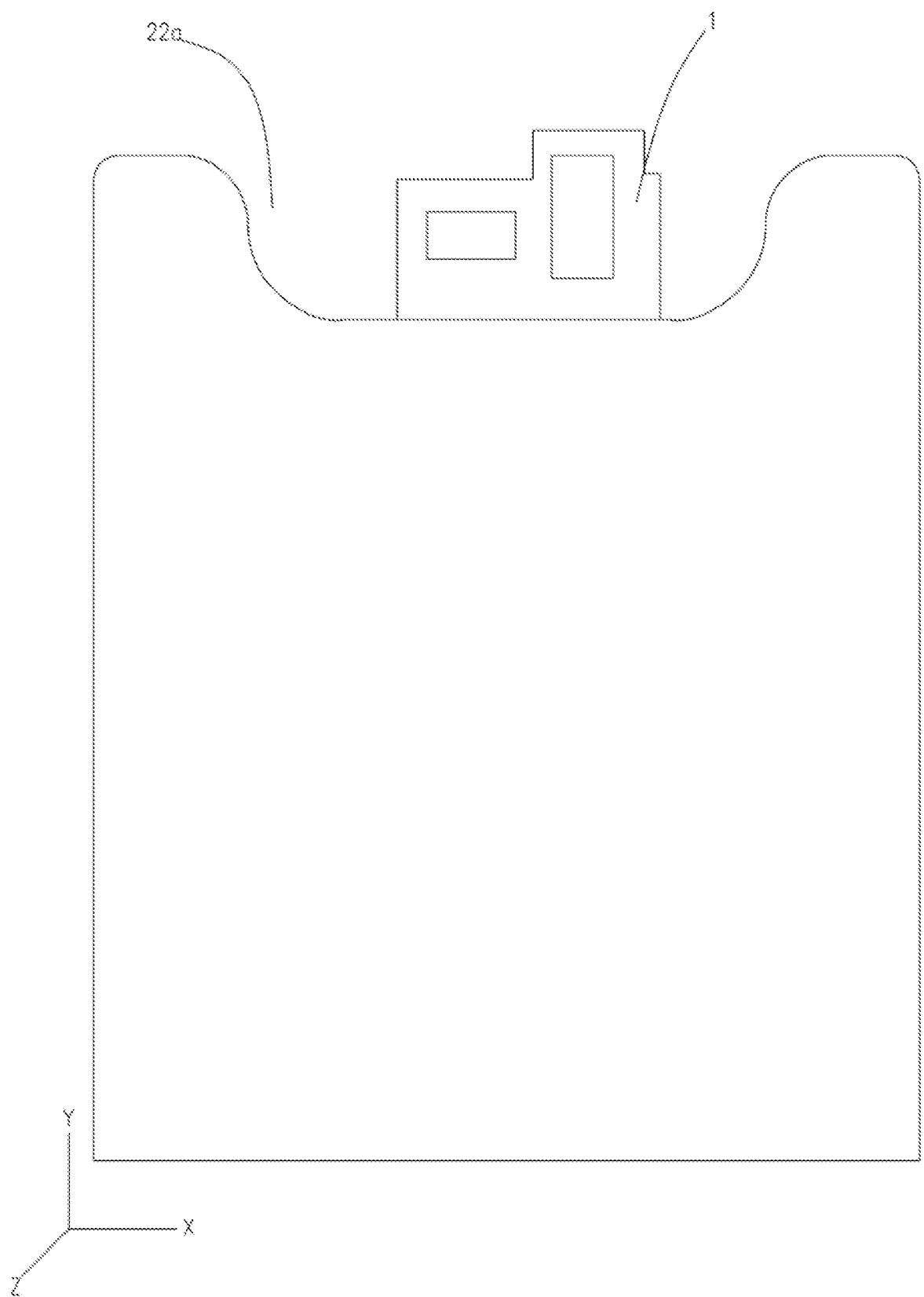
FIG. 23 is a schematic view of a display assembly of a display module according to yet another example.

In one example, the electronic assembly 1 is located at a side of the non-display area Z2. That is, shown in FIG. 20, the electronic assembly 1 is located at a side of the groove 22a. In this case, it is possible to design other components into the groove 22a in the X direction, such as a camera module. In another example, the electronic assembly 1 is located at middle of the non-display area Z2. As shown in FIG. 23, the electronic assembly 1 may be located at the middle of the groove 22a, and the other components may be located at both sides of the electronic assembly 1.

When the electronic device 100 is assembled, the sensor 11 is firstly disposed on the flexible circuit board 12 and electrically connected to the flexible circuit board 12. Then, the receiver 13 opposite to the sensor 11 is disposed on the flexible circuit board 12, so that the sensor 11, the flexible circuit board 12, and the receiver 13 are stacked together to form the electronic component 1. The electronic component 1 is then assembled against the display module 2 so that the receiving hole 123 of the electronic assembly 1 is aligned with the receiving window 21a on the cover plate 21, and the parts of the receiver 13 and the sensor 11 are located in the groove 22a, and the remaining parts of the sensor 11 and the receiver 13 overlaps with the recessed display assembly 22.

Figure 24:
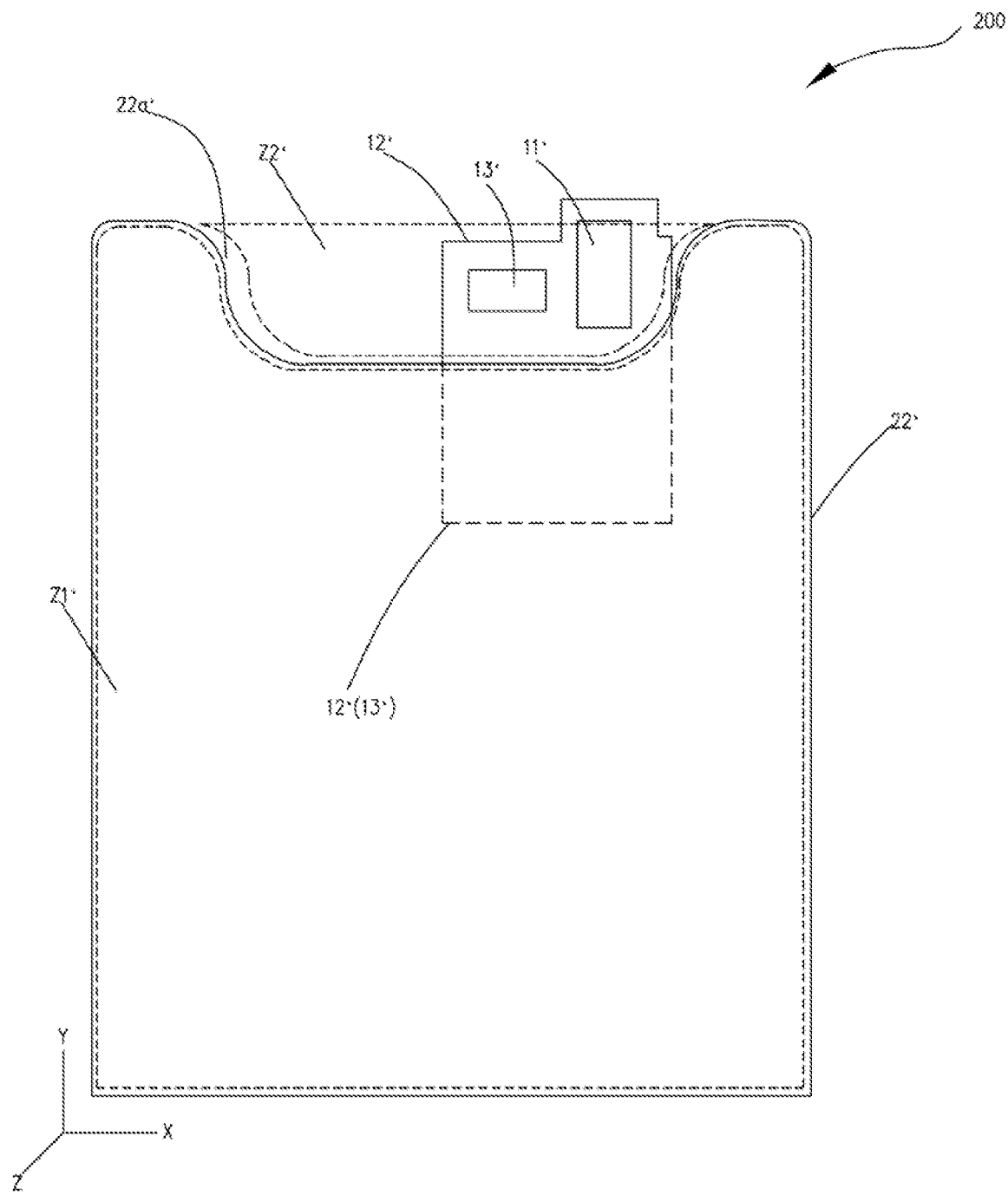
FIG. 24 is a schematic view of an exemplary electronic device according to another embodiment of the present disclosure.

An electronic device 200 in accordance with another exemplary embodiment is illustrated in FIG. 24. The electronic device 200 will be described in the following with reference to FIG. 24.

The electronic device 200 in this embodiment is substantially the same as the electronic device 100 the above embodiment. The differences between the electronic devices 100 and 200 lie in: the electronic device 200 may include a receiver 13', a sensor 11', and a display screen 22'. The receiver 13' and the sensor 11' are stacked in a thickness direction of the display screen 22'. A groove 22a' is defined along an edge of the display screen 22'. The receiver 13' and the sensor 11' are located within the groove 22a'. The display screen 22' has a display area Z1'. At least a part of the receiver 13' is overlapped with the display area Z1'.

As shown in FIG. 24, an area of the display screen 22 is used as the display area Z1, and an area of the groove 22a is used as the non-display area Z2'. The receiver 13' and the sensor 11' face to the display screen 22'. As at least a part of the receiver 13' is overlapped with the display area Z1', at least part of an orthographic projection area of the receiver 13' is located in the non-display area Z2'

As shown in FIG. 24, at least one part of the sensor 11' is located in the non-display area Z2'. The receiver 13' and the sensor 11' are located at a side of the groove 22a'. In this case, it is possible to design other components into the groove 22a' in the X direction, such as a camera module.

As the receiver 13' and the sensor 11' are stacked in the thickness direction, i.e. Z direction, the size of the electronic device 200 in the Z direction may be reduced. Further, as at least a part of the receiver 13' is overlapped with the display area Z1', the size of the non-display area Z2' in the Y direction may be further reduced. That is, the size of the display area Z1' can be increased, and the screen ratio of the electronic device 200 is further improved.

As shown in FIG. 24, the electronic device 200 may further include a flexible circuit board 12'. The flexible circuit board 12' is electrically connected to the sensor 11', and the receiver 13' and the sensor 11' are disposed on a side of the flexible circuit board 12', respectively.

In one example, an orthographic projection area of the sensor 11' on the flexible circuit board 12' is located in an orthographic projection area of the receiver 13' on the flexible circuit board 12'.

It is noted that, the specific connection relationship and the position relationship for the sensor 11', the flexible circuit board 12' and the receiver 13' are referred to the above description on the electronic device 100 in above embodiments, which are described with reference to FIGS. 3-23, and are not described in detail herein.

Figure 25:
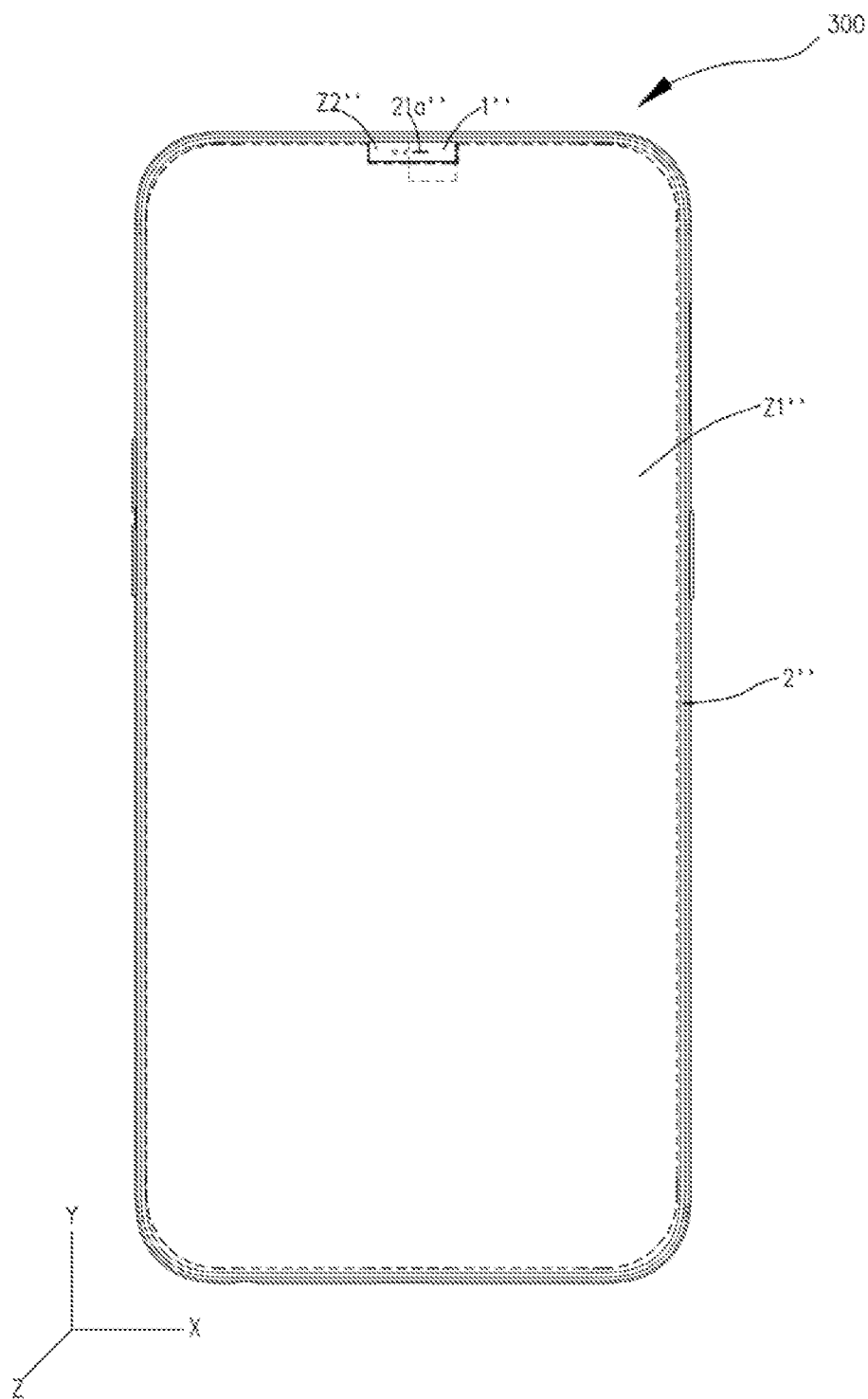
FIG. 25 is a schematic view of an exemplary electronic device according to yet another embodiment of the present disclosure.
Figure 26:
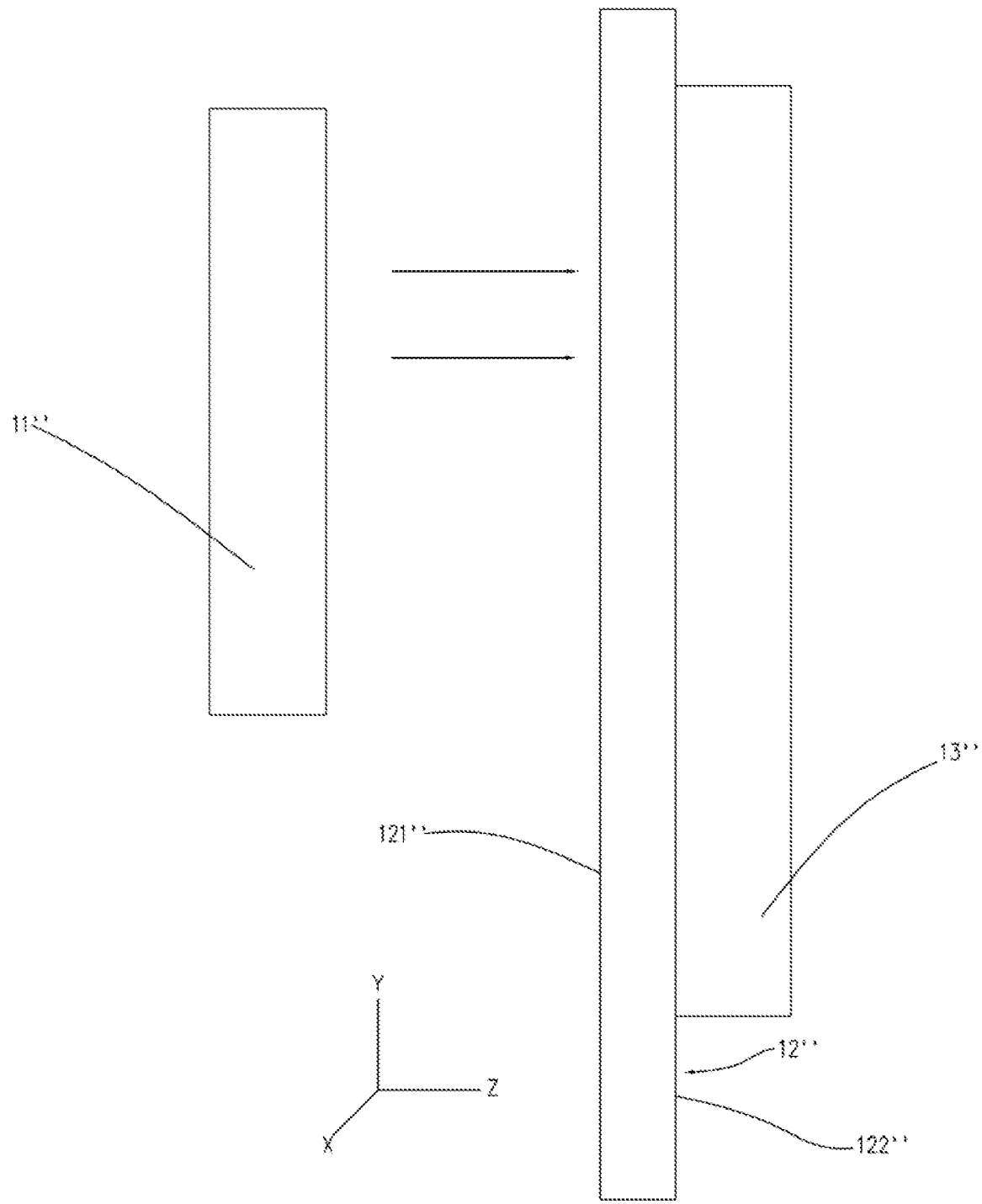
FIG. 26 is a schematic view of a sensor, a flexible circuit board, and a receiver in the electronic device of FIG. 25.

An electronic device 300 in accordance with yet another exemplary embodiment is illustrated in FIGS. 25-26. The electronic device 300 will be described in the following with reference to FIGS. 25-26.

The electronic device 300 may a display assembly 2", a flexible circuit board 12", and a receiver 13". The display assembly 2" has a non-display area Z2". A receiving window 21a" is defined in the non-display area Z2". The flexible circuit board 12" may include a first face 121" and a second face 122" opposite to the first face 121". The first face 121" of the flexible circuit board 12" is configured to be disposed a sensor 11" and be electrically connected to the flexible circuit board 12". The receiver 13" is disposed on the second face 122" of the flexible circuit board 12". A sound channel 131" for the receiver 13" may be communicated to the receiving window 21a" through the flexible circuit board 12" or bypassing the flexible circuit board 12".

It is noted that, the specific connection relationship and the position relationship for the display assembly 22", the flexible circuit board 12" and the receiver 13" are referred to the above description on the electronic device 100 in above embodiments, which are described with reference to FIGS. 3-23, and are not described in detail herein.

Figure 27:
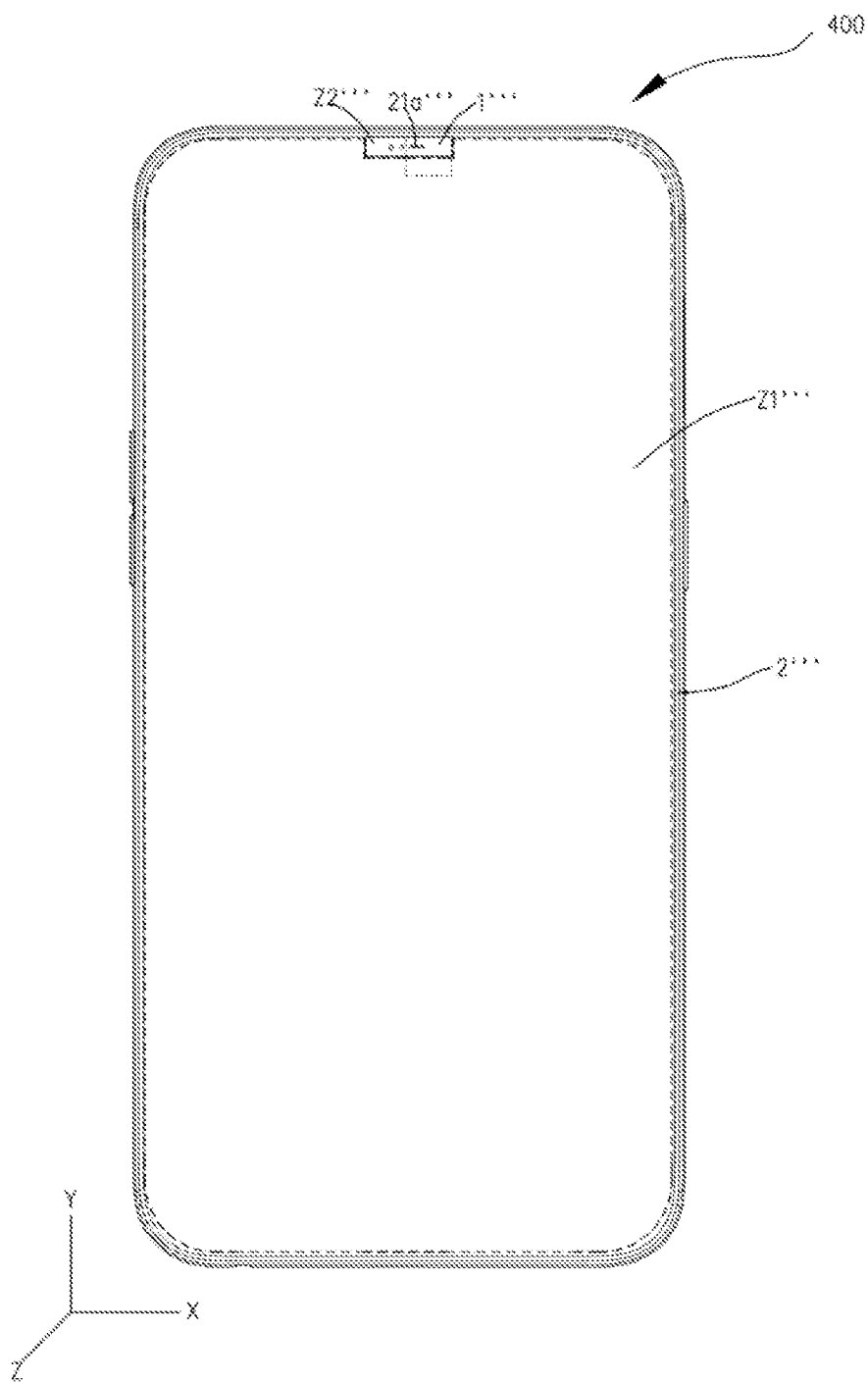
FIG. 27 is a schematic view of an exemplary electronic device according to yet another embodiment of the present disclosure.
Figure 28:
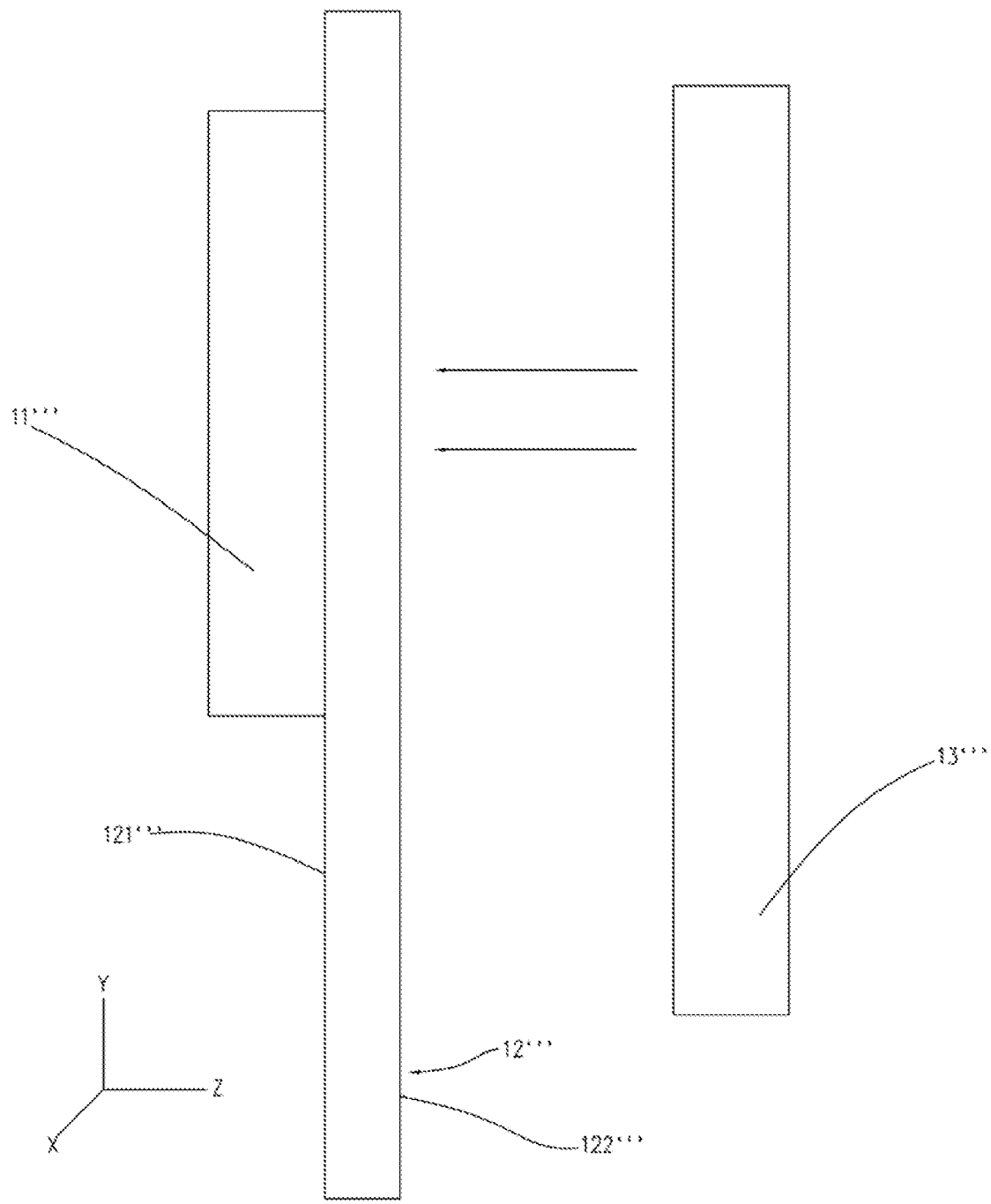
FIG. 28 is a schematic view of a sensor, a flexible circuit board, and a receiver in the electronic device of FIG. 27.

An electronic device 400 in accordance with yet another exemplary embodiment is illustrated in FIGS. 27-28. The electronic device 400 will be described in the following with reference to FIGS. 27-28.

The electronic device 400 may a display assembly 2''', a flexible circuit board 12''', and a sensor 11'''. The display assembly 2''' has a non-display area Z2'''. A receiving window 21a''' is defined in the non-display area Z2'''. The flexible circuit board 12''' may include a first face 121''' and a second face 122''' opposite to the first face 121''' The sensor 11''' is disposed on the first face 121''' of the flexible circuit hoard 12''' and electrically connected to the flexible circuit board 12'''. The second face 122''' of the flexible circuit board 12''' is configured to be disposed a receiver 13'''. The flexible circuit board 12''' is configured to bypassed by or through a sound channel 131''', so that the sound channel 131''' for the receiver 13''' may be communicated to the receiving window 21a'''.

It is noted that, the specific connection relationship and the position relationship for the display assembly 22''', the flexible circuit board 12''' and the sensor 11''' are referred to the above description on the electronic device 100 in above embodiments, which are described with reference to FIGS. 3-23, and are not described in detail herein.

The foregoing disclosed is merely exemplary implementations and it is not intended to limit the scope of the present disclosure; equivalents changes made on the basis of the claims of the present disclosure shall fall into the scope of the present disclosure.

What is claimed is:

1. An electronic assembly, comprising:
   a flexible circuit board, comprising a first face and a second face opposite to the first face;
   a sensor, disposed on the first face of the flexible circuit board and electrically connected to the flexible circuit board; and
   a receiver, disposed on the second face of the flexible circuit board, wherein a sound channel for the receiver is connected to the outside bypassing the flexible circuit board or through the flexible circuit board;
   wherein a projection area of the sensor on the first face of the flexible circuit board is located on a projection area of the receiver on the second face of the flexible circuit board.

2. The electronic assembly of claim 1, wherein the receiver is wholly covered with and sealingly connected to the flexible circuit board, wherein a receiving hole is defined in the flexible circuit board such that a channel between a vibrating portion of the receiver and the receiving hole is formed as the sound channel.

3. The electronic assembly of claim 2, further comprising:
   a seal, disposed between the flexible circuit board and the receiver such that the receiver is sealingly connected to the flexible circuit board, wherein the seal is hollowed and disposed on a circumference of the flexible circuit board.

4. The electronic assembly of claim 3, wherein an area where the vibrating portion is located is located in an orthographic projection area of an inner wall of the seal on the receiver, and an orthographic projection area of an inner wall of the receiving hole on the receiver is overlapped with a part of an area where the vibrating portion is located.

5. The electronic assembly of claim 3, wherein the seal defines a through hole, and a diameter of the through hole increases in a direction from the vibration portion to the flexible circuit board.

6. The electronic assembly of claim 5, further comprising:
   a sealing element, disposed between the flexible circuit board and the receiver such that the flexible circuit board is sealingly connected to the part of the receiver.

7. The electronic assembly of claim 3, wherein the seal defines a through hole, and a diameter of the through hole increases and then decreases in a direction from the vibration portion to the flexible circuit board.

8. The electronic assembly of claim 3, wherein a limiting slot is defined in an outer wall of the seal.

9. The electronic assembly of claim 2, wherein the flexible circuit board comprises:
   a first sidewall;
   a second sidewall, opposite to the first sidewall;
   a third sidewall; and
   a fourth sidewall, opposite to the third sidewall;
   wherein the third sidewall and the fourth sidewall are connected between the first sidewall and the second sidewall, respectively, and a part of the second sidewall is protruded along a direction of the third sidewall such that the flexible circuit board is connected to a main circuit board; and
   wherein the sensor is disposed at a corner formed by the first sidewall and the third sidewall.

10. The electronic assembly of claim 9, wherein both the receiving hole and the sensor are arranged close to the first sidewall.

11. The electronic assembly of claim 1, further comprising:
   a seal, wholly covered with and sealingly connected to the receiver, wherein the seal comprises a first sealing portion and a second sealing portion connected to the first sealing portion, wherein the flexible circuit board is disposed on the first sealing portion, and a receiving hole is defined in the second sealing portion such that a channel between a vibrating portion of the receiver and the receiving hole is formed as the sound channel.

12. The electronic assembly of claim 1, further comprising:
a seal, bonded to a sidewall of the flexible circuit board and covered with and sealingly connected to a part of the receiver, wherein the flexible circuit board is covered with remaining part of the receiver, and a receiving hole is defined in the seal such that a channel between a vibrating portion of the receiver and the receiving hole is formed as the sound channel.

13. An electronic device, comprising:
an electronic assembly, wherein the electronic assembly comprises:
a flexible circuit board, comprising a first face and a second face opposite to the first face;
a sensor, disposed on the first face of the flexible circuit board and electrically connected to the flexible circuit board; and
a receiver, disposed on the second face of the flexible circuit board, wherein a sound signal is transmitted to the outside bypassing the flexible circuit board or through the flexible circuit board;
wherein a projection area of the sensor on the first face of the flexible circuit board is located on a projection area of the receiver on the second face of the flexible circuit board.

14. The electronic device of claim 13, further comprising:
a display module, having a display area and a non-display area, wherein at least one part of the sensor and at least one part of the receiver are located in the non-display area, a receiving window is defined in the non-display area, and the sound signal is communicated to the receiving window.

15. The electronic device of claim 14, wherein the first face of the flexible circuit board faces the display module such that the sensor faces to the non-display area.

16. The electronic device of claim 14, wherein the display module comprises:
a cover plate; and
a display assembly, stacked with the cover plate and having two short sidewalls opposite to each other and two long sidewalls opposite to each other, wherein the two long sidewalls are connected between the two short sidewalls, respectively, and one of the two short sidewalls is recessed toward the other one, and wherein a non-projection area of the recessed display assembly on the cover plate is defined as the non-display area.

17. The electronic device of claim 16, wherein the sensor and the receiver are located at a side of the non-display area; and
the non-display area is located at a corner of the cover plate.

18. An electronic device, comprising:
a receiver;
a sensor;
a flexible circuit board, electrically connected to the sensor, wherein the receiver and the sensor are disposed on a side of the flexible circuit board, respectively; and
a display screen, having a display area, wherein a groove is defined along an edge of the display screen;
wherein the receiver and the sensor are stacked in a thickness direction of the display screen and located within the groove, and at least a part of the receiver is overlapped with the display area;
wherein a projection area of the sensor on a first face of the flexible printed circuit board is located on a projection area of the receiver on a second face of the flexible printed circuit.

* * * * *